United States Patent
Lee et al.

(10) Patent No.: US 10,461,167 B2
(45) Date of Patent: Oct. 29, 2019

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Dongsoo Lee, Gunpo-si (KR); Wonkeun Chung, Seoul (KR); Hoonjoo Na, Hwaseong-si (KR); Suyoung Bae, Daegu (KR); Jaeyeol Song, Seoul (KR); Jonghan Lee, Namyangju-si (KR); HyungSuk Jung, Suwon-si (KR); Sangjin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/861,949

(22) Filed: Jan. 4, 2018

(65) Prior Publication Data
US 2018/0374926 A1    Dec. 27, 2018

(30) Foreign Application Priority Data
Jun. 23, 2017  (KR) .................. 10-2017-0079888

(51) Int. Cl.
| H01L 29/49 | (2006.01) |
| H01L 21/82 | (2006.01) |
| H01L 29/66 | (2006.01) |
| H01L 29/78 | (2006.01) |
| H01L 21/02 | (2006.01) |

(Continued)

(52) U.S. Cl.
CPC .......... *H01L 29/4983* (2013.01); *H01L 29/36* (2013.01)

(58) Field of Classification Search
CPC ................................................. H01L 29/4983
See application file for complete search history.

(56) References Cited

U.S. PATENT DOCUMENTS

| 6,861,712 B2 | 3/2005 | Gao et al. |
| 9,093,550 B1 | 7/2015 | Zhao et al. |
| 9,287,273 B2 | 3/2016 | Ragnarsson et al. |

(Continued)

FOREIGN PATENT DOCUMENTS

KR    10-2016-0095399 A    8/2016

*Primary Examiner* — Moazzam Hossain
*Assistant Examiner* — Omar F Mojaddedi
(74) *Attorney, Agent, or Firm* — Harness, Dickey & Pierce, P.L.C.

(57) ABSTRACT

Disclosed are semiconductor devices and methods of manufacturing the same. The semiconductor device comprises a first transistor on a substrate, and a second transistor on the substrate. Each of the first and second transistors includes a plurality of semiconductor patterns vertically stacked on the substrate and vertically spaced apart from each other, and a gate dielectric pattern and a work function pattern filling a space between the semiconductor patterns. The work function pattern of the first transistor includes a first work function metal layer, the work function pattern of the second transistor includes the first work function metal layer and a second work function metal layer, the first work function metal layer of each of the first and second transistors has a work function greater than that of the second work function metal layer, and the first transistor has a threshold voltage less than that of the second transistor.

20 Claims, 24 Drawing Sheets

(51) Int. Cl.
    *H01L 29/06*     (2006.01)
    *H01L 29/36*     (2006.01)

(56) References Cited

U.S. PATENT DOCUMENTS

| | | |
|---|---|---|
| 9,362,284 B2 | 6/2016 | Togo et al. |
| 9,406,679 B2 | 8/2016 | Edge et al. |
| 9,461,132 B2 | 10/2016 | Cheon et al. |
| 9,653,289 B1 * | 5/2017 | Balakrishnan ........ H01L 27/088 |
| 2015/0380539 A1 | 12/2015 | Colinge et al. |
| 2016/0064378 A1 | 3/2016 | Kwon et al. |
| 2016/0225868 A1 | 8/2016 | Kim et al. |
| 2017/0033020 A1 | 2/2017 | Machkaoutsan et al. |
| 2017/0170331 A1 | 6/2017 | Liang et al. |
| 2018/0226490 A1 * | 8/2018 | Le ......................... B82Y 10/00 |

* cited by examiner

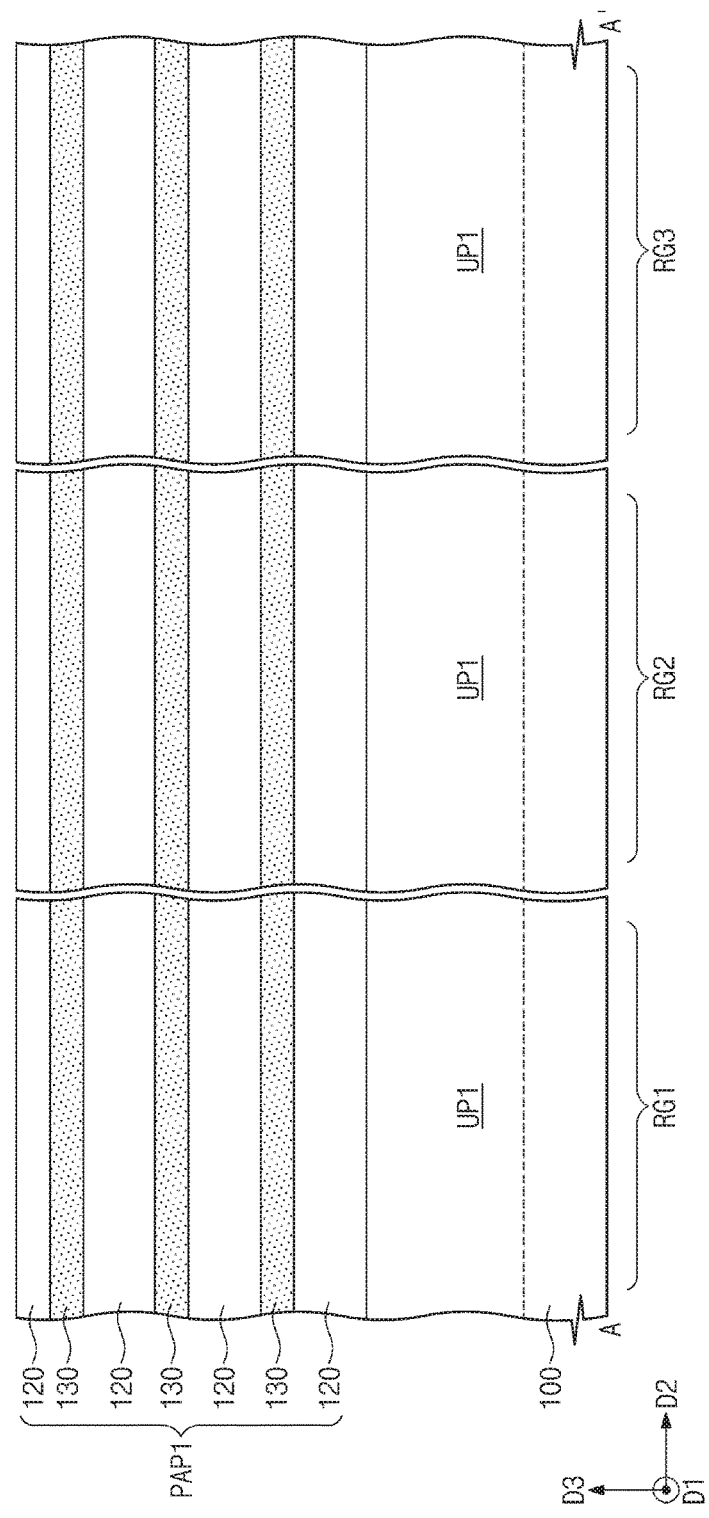

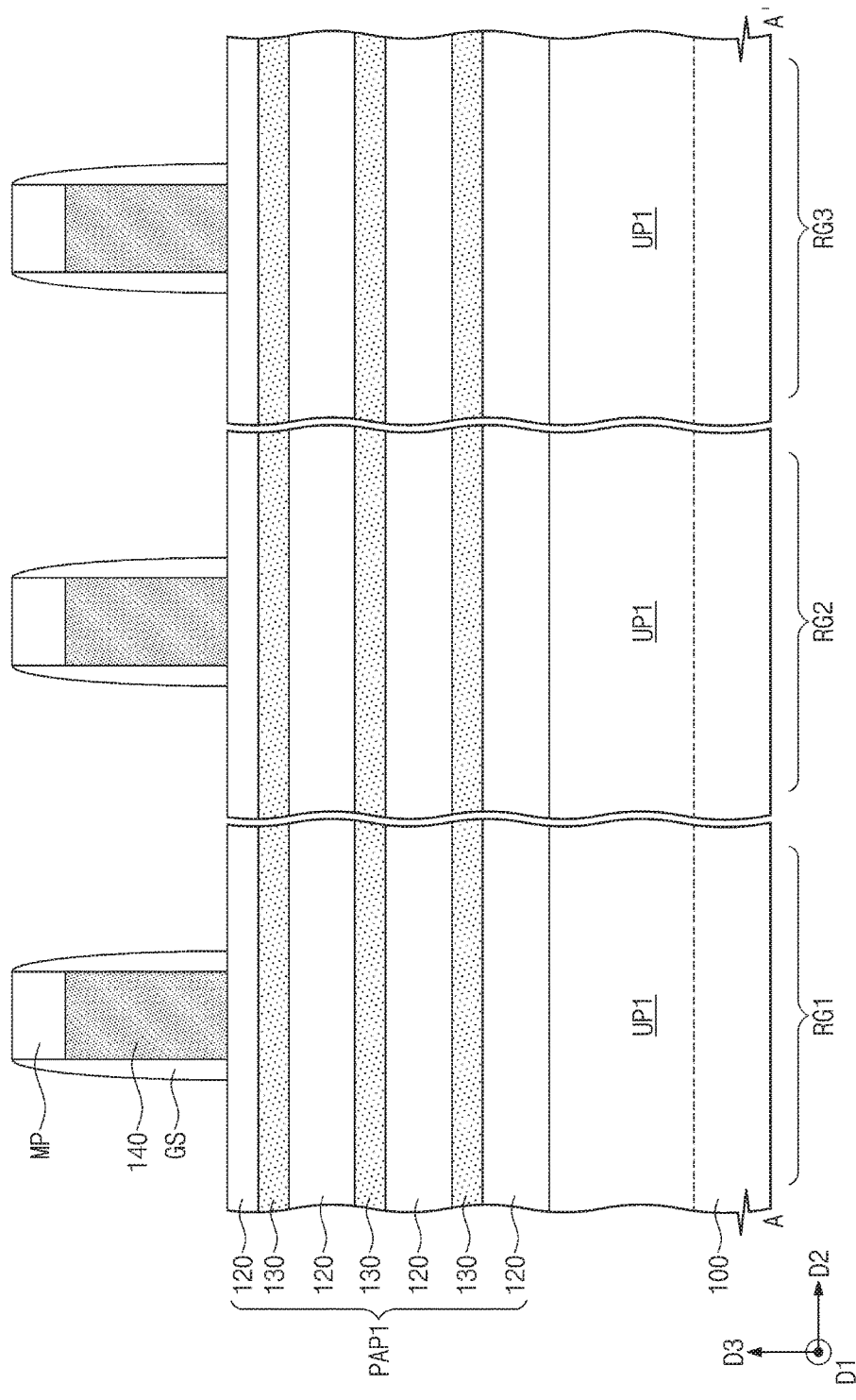

US 10,461,167 B2

SEMICONDUCTOR DEVICE AND METHOD OF MANUFACTURING THE SAME

CROSS-REFERENCE TO RELATED APPLICATIONS

This U.S. nonprovisional patent application claims priority under 35 U.S.C § 119 of Korean Patent Application No. 10-2017-0079888 filed on Jun. 23, 2017, the entire contents of which are hereby incorporated by reference.

BACKGROUND

Inventive concepts relate to semiconductor, and more particularly, to a semiconductor device including a gate-all-around type transistor and a method of manufacturing the same.

A semiconductor device is considered to be an important factor in electronic industry because of small size, multi-functionality, and/or low fabrication cost. A semiconductor device may be categorized as any one of a semiconductor memory device storing data and/or machine readable instructions, a semiconductor logic device processing operations of logic data, and a hybrid semiconductor device having both memory and logic elements. Semiconductor devices have been increasingly desired, or alternatively required, for high integration with the advanced development of the electronic industry. For example, a semiconductor device has been increasingly requested for high reliability, high speed, and/or multi-functionality. Semiconductor devices have gradually complicated and integrated to meet these requested characteristics.

SUMMARY

Some embodiments of inventive concepts provide a semiconductor device including gate-all-around type transistors with various threshold voltages.

Some embodiments of inventive concepts provide a method of manufacturing a semiconductor device including gate-all-around type transistors with various threshold voltages.

According to some example embodiments of inventive concepts, a semiconductor device may comprise a first transistor on a substrate, and a second transistor on the substrate. Each of the first and second transistors includes a plurality of semiconductor patterns vertically stacked on the substrate and vertically spaced apart from each other, and a gate dielectric pattern and a work function pattern filling a space between the semiconductor patterns. The work function pattern of the first transistor includes a first work function metal layer, the work function pattern of the second transistor includes the first work function metal layer and a second work function metal layer, the first work function metal layer of each of the first and second transistors has a work function greater than that of the second work function metal layer, and the first transistor has a threshold voltage less than that of the second transistor.

According to some example embodiments of inventive concepts, a semiconductor device may comprise a first transistor on a substrate and a second transistor on the substrate. Each of the first and second transistors includes a plurality of semiconductor patterns vertically stacked on the substrate and vertically spaced apart from each other, and a gate dielectric pattern and a work function pattern that fill a space between the semiconductor patterns. The space of the first transistor has the same size as that of the space of the second transistor, the work function pattern of the first transistor comprises a first work function metal layer, the work function pattern of the second transistor comprises a first work function metal layer and a second work function metal layer, and the first transistor has a threshold voltage different from that of the second transistor.

According to some example embodiments of inventive concepts, a method of manufacturing a semiconductor device may comprise forming sacrificial layers and semiconductor layers alternately and repeatedly stacked on a substrate, forming sacrificial gate patterns crossing over the sacrificial layers and the semiconductor layers and extending in one direction, removing the sacrificial gate patterns to form a first trench and a second trench that expose the semiconductor layers and the sacrificial layers, selectively removing the sacrificial layers exposed to the first and second trenches, forming a first work function pattern that fills a first space between the semiconductor layers in the first trench, and forming a second work function pattern that fills a second space between the semiconductor layers in the second trench. The first work function pattern comprises a first work function metal layer, the second work function pattern comprises a first work function metal layer and a second work function metal layer, the first space and the second space have the same size as each other, and the first work function pattern and the second work function pattern have different work functions from each other.

BRIEF DESCRIPTION OF THE DRAWINGS

FIGS. 4A, 6A, 8A, and 10A illustrate cross-sectional views taken along line A-A' of FIGS. 3, 5, 7, and 9, respectively.

DETAILED DESCRIPTION OF EXAMPLE EMBODIMENTS

Figure 1:
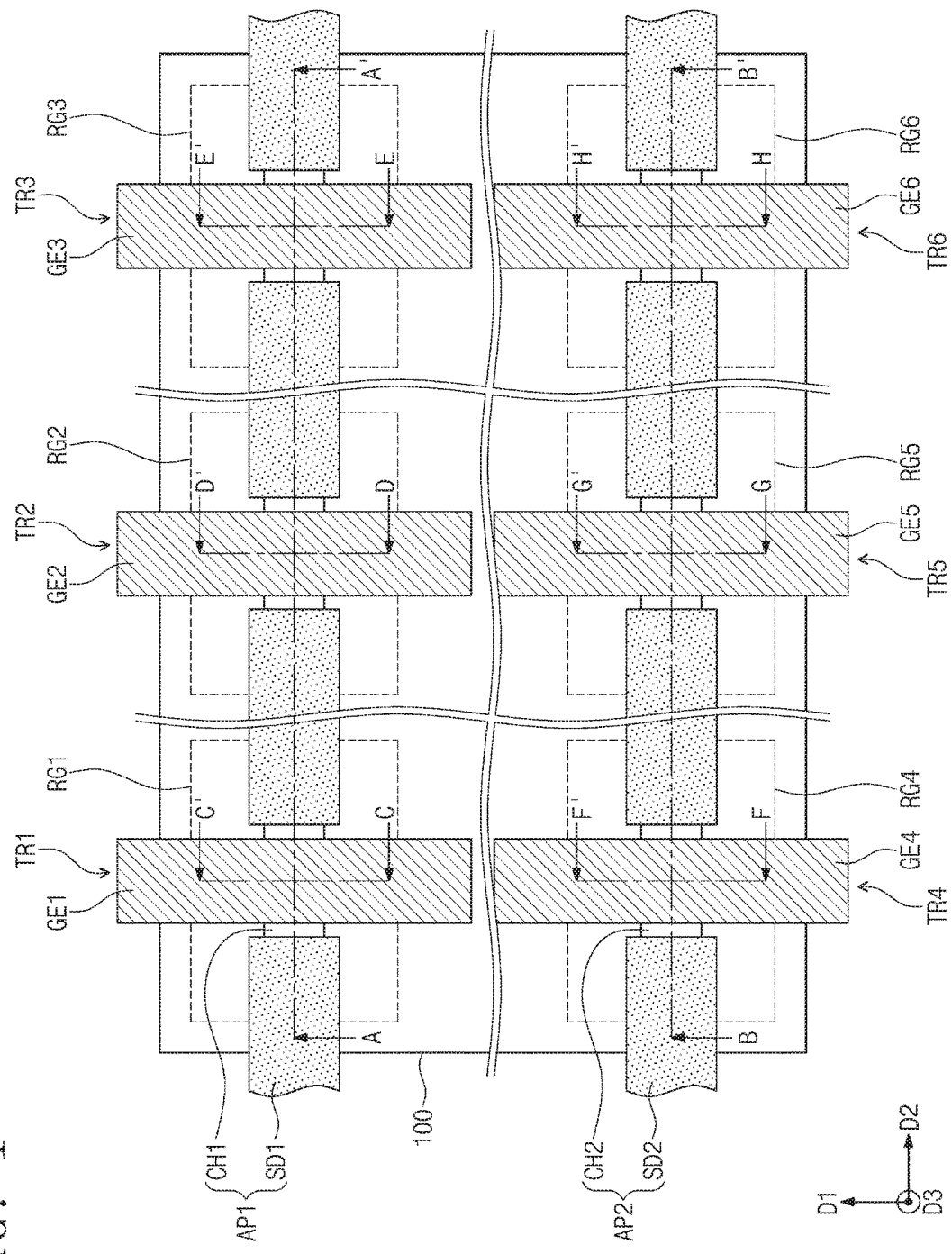
FIG. 1 illustrates a plan view showing a semiconductor device according to some example embodiments of inventive concepts.
Figure 2A:
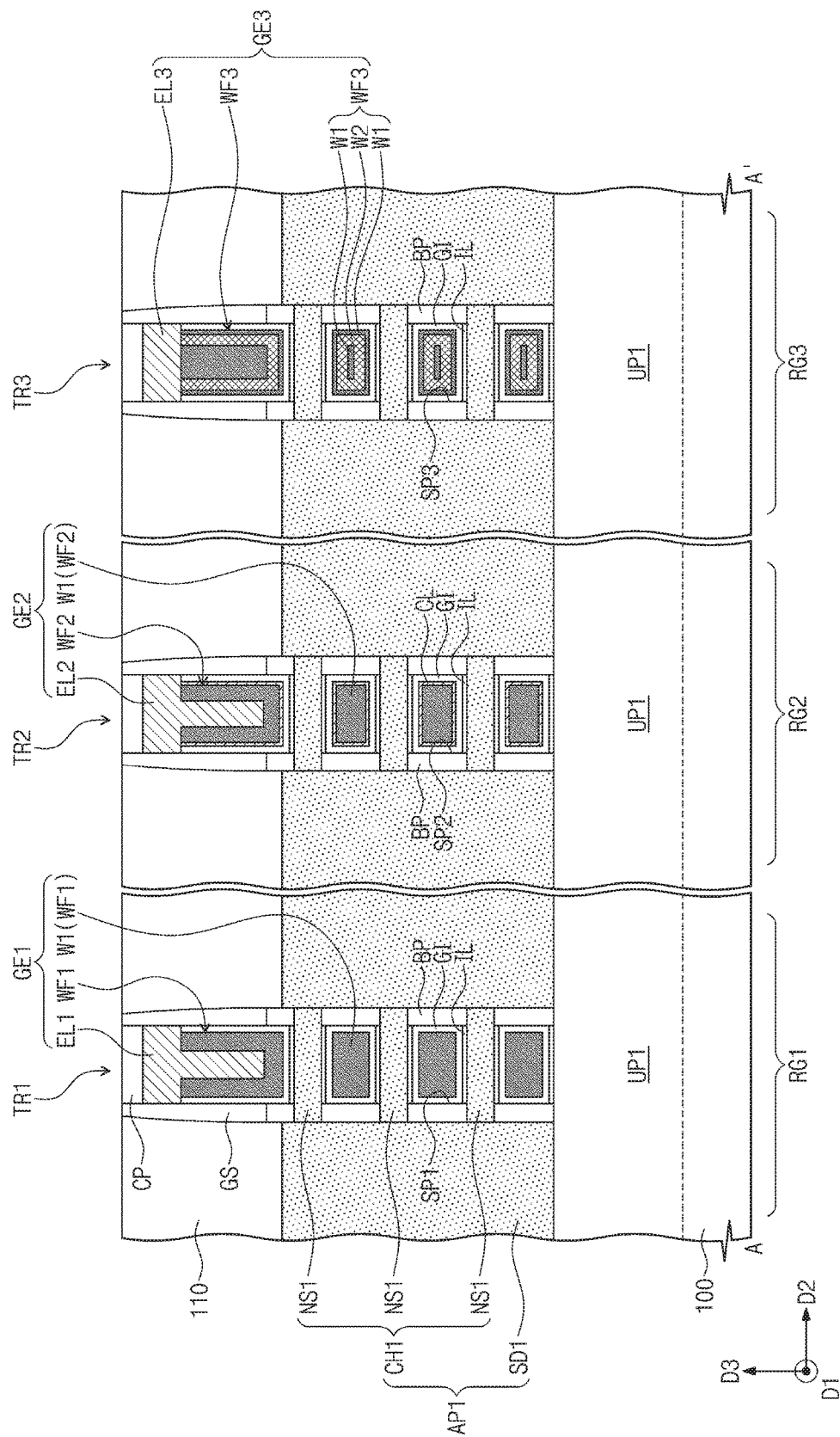
FIG. 2A illustrates a cross-sectional view taken along line A-A' of FIG. 1.
Figure 2B:
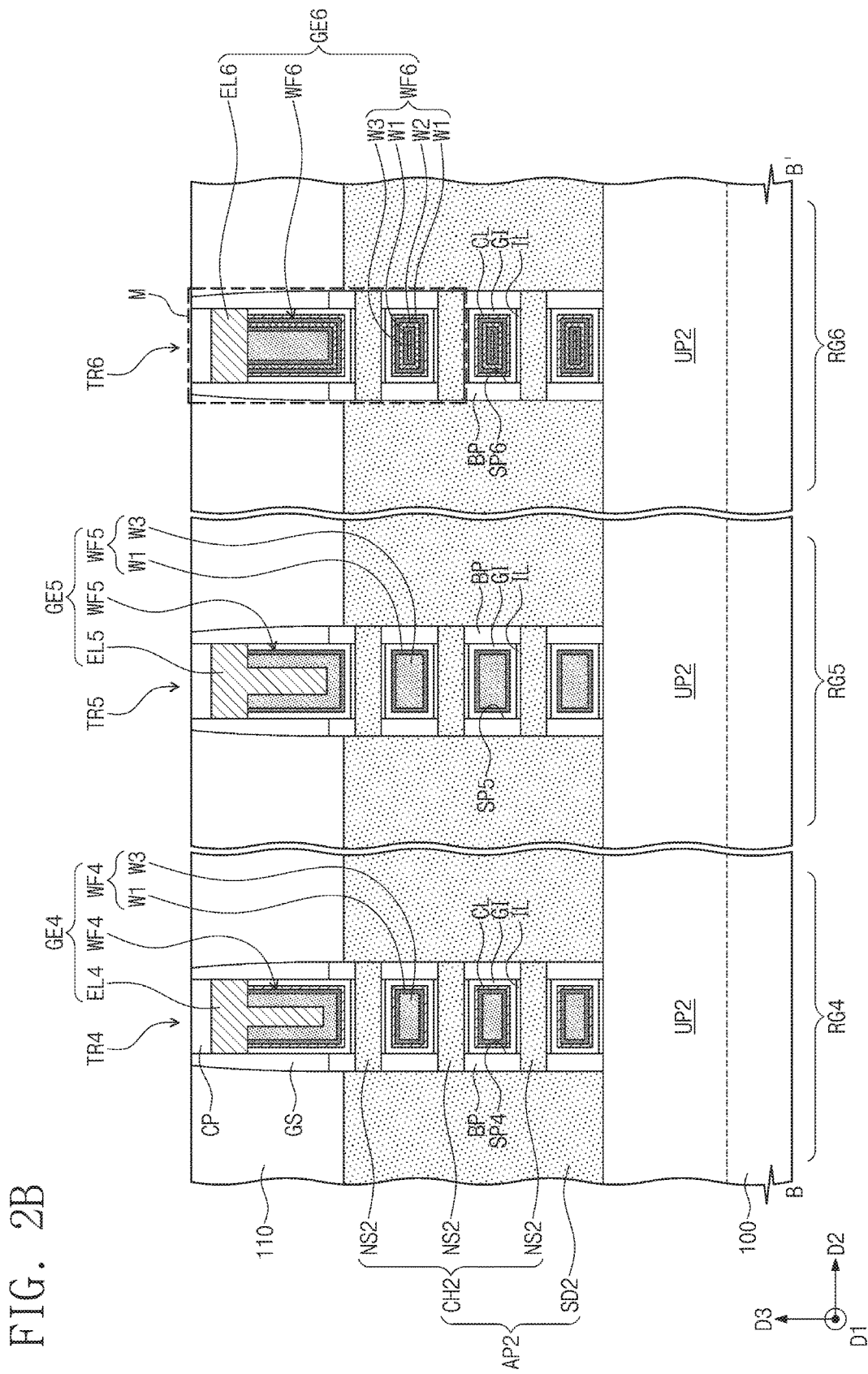
FIG. 2B illustrates a cross-sectional view taken along line B-B' of FIG. 1.
Figure 2C:
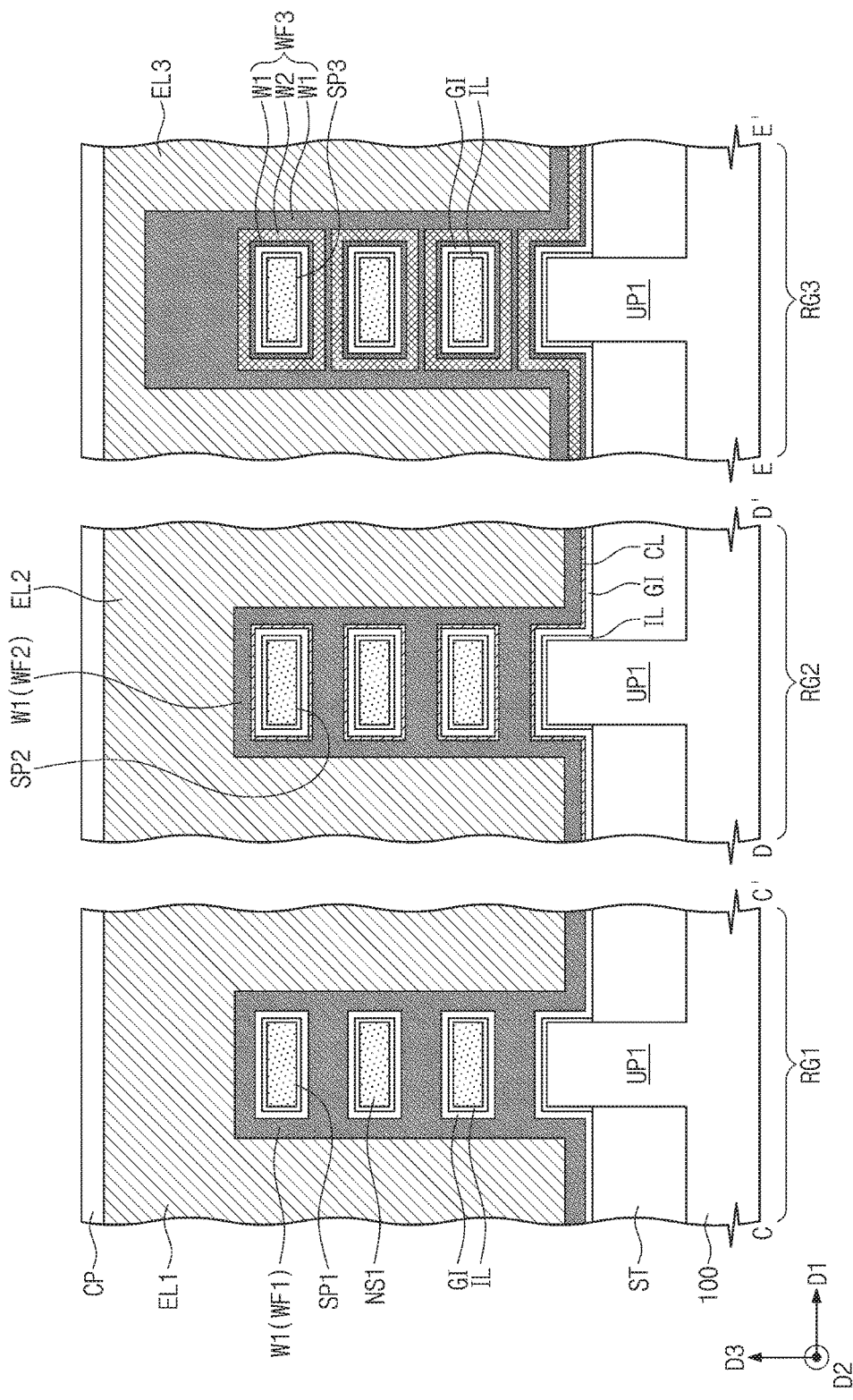
FIG. 2C illustrates a cross-sectional view taken along lines C-C', D-D', and E-E' of FIG. 1.
Figure 2D:
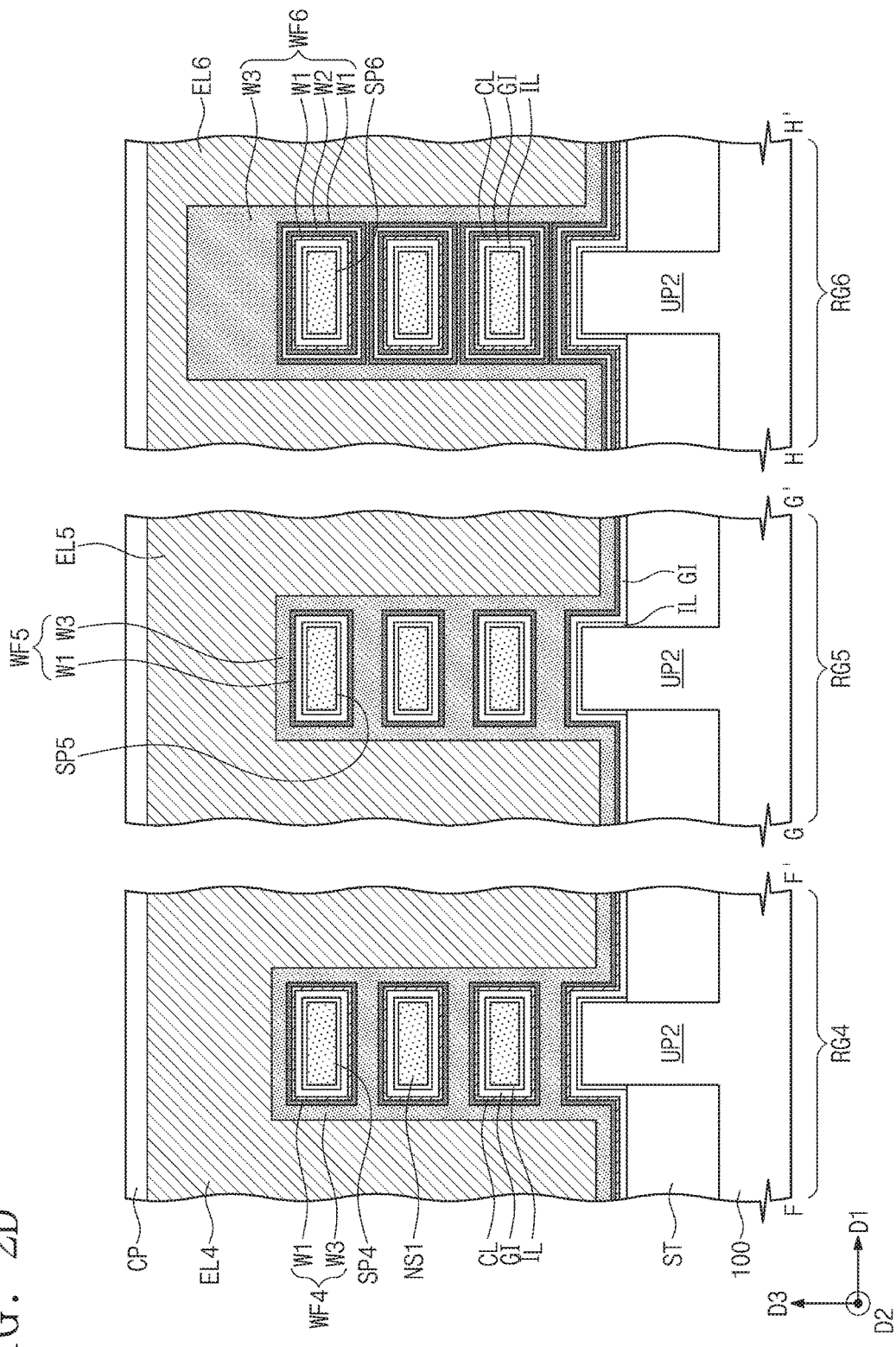
FIG. 2D illustrates a cross-sectional view taken along lines F-F', G-G', and H-H' of FIG. 1.

FIG. 1 illustrates a plan view showing a semiconductor device according to some example embodiments of inventive concepts. FIG. 2A illustrates a cross-sectional view taken along line A-A' of FIG. 1. FIG. 2B illustrates a cross-sectional view taken along line B-B' of FIG. 1. FIG. 2C illustrates a cross-sectional view taken along lines C-C', D-D', and E-E' of FIG. 1. FIG. 2D illustrates a cross-sectional view taken along lines F-F', G-G', and H-H' of FIG. 1.

Referring to FIGS. 1 and 2A to 2D, a substrate 100 may be provided to include first to sixth regions RG1 to RG6. The substrate 100 may be or include a semiconductor substrate. For example, the substrate 100 may be a silicon substrate or a germanium substrate. Alternatively, the substrate 100 may be or include a Silicon-On-Insulator (SOI) substrate. First to sixth transistors TR1 to TR6 may be respectively provided on the first to sixth regions RG1 to RG6 of the substrate 100.

At least some of the first to sixth regions RG1 to RG6 of the substrate 100 may be or include a memory cell region where a plurality of memory cells are formed to store data. For example, the memory cell region of the substrate 100 may be provided thereon with memory cell transistors included in a plurality of SRAM cells. The first to sixth transistors TR1 to TR6 may be some of the memory cell transistors.

Alternatively or additionally, at least some of the first to sixth regions RG1 to RG6 of the substrate 100 may be or include a logic cell region where logic transistors are to be included in a logic circuit of a semiconductor device. For example, logic transistors may be on the logic cell region of the substrate 100. The first to sixth transistors TR1 to TR6 may be some of the logic transistors. Inventive concepts, however, are not limited thereto.

The first to third transistors TR1 to TR3 on the first to third regions RG1 to RG3 may have conductive types different from those of the fourth to sixth transistors TR4 to TR6 on the fourth to sixth regions RG4 to RG6. For example, the first to third transistors TR1 to TR3 on the first to third regions RG1 to RG3 may be PMOSFETs, and the fourth to sixth transistors TR4 to TR6 on the fourth to sixth regions RG4 to RG6 may be NMOSFETs.

A device isolation layer ST may be provided on the substrate 100. The device isolation layer ST may define first and second upper patterns UP1 and UP2 on an upper portion of the substrate 100. The first upper pattern UP1 may be on the first to third regions RG1 to RG3, and the second upper pattern UP2 may be on the fourth to sixth regions RG4 to RG6. The device isolation layer ST may fill trenches on opposite sides of each of the first and second upper patterns UP1 and UP2. The device isolation layer ST may have a top surface lower than those of the first and second upper patterns UP1 and UP2.

A first active pattern AP1 may be provided on the first upper pattern UP1, and a second active pattern AP2 may be provided on the second upper pattern UP2. For example, the first active pattern AP1 may vertically overlap the first upper pattern UP1, and the second active pattern AP2 may vertically overlap the second upper pattern UP2. The first and second active patterns AP1 and AP2 may have a linear shape extending in a second direction D2.

The first active pattern AP1 may include first channel patterns CH1 and first source/drain patterns SD1. Each of the first channel patterns CH1 may be between a pair of the first source/drain patterns SD1. The second active pattern AP2 may include second channel patterns CH2 and second source/drain patterns SD2. Each of the second channel patterns CH2 may be between a pair of the second source/drain patterns SD2.

The first channel pattern CH1 may include a plurality of first semiconductor patterns NS1 that are vertically stacked. The first semiconductor patterns NS1 may be spaced apart from each other in a third direction D3 perpendicular to a top surface of the substrate 100. The first semiconductor patterns NS1 may vertically overlap each other. Each of the first source/drain patterns SD1 may be in contact, e.g. direct contact, with sidewalls of the first semiconductor patterns NS1. For example, the first semiconductor patterns NS1 may connect a pair of neighboring first source/drain patterns SD1 to each other. The first channel pattern CH1 may include three first semiconductor patterns NS1, but the number of the first semiconductor patterns NS1 is not especially limited to three, and may be more, or less, than three.

The second channel pattern CH2 may include a plurality of second semiconductor patterns NS2 that are vertically stacked. The second semiconductor patterns NS2 may be spaced apart from each other in the third direction D3. The second semiconductor patterns NS2 may vertically overlap each other. Each of the second source/drain patterns SD2 may be in contact, e.g. direct contact, with sidewalls of the second semiconductor patterns NS2. The second channel pattern CH2 may include three second semiconductor patterns NS2, but the number of the second semiconductor patterns NS2 is not especially limited to three, and may be more, or less, than three.

The first semiconductor patterns NS1 at the same level may be formed from the same semiconductor layer. The first semiconductor patterns NS1 at the same level may have the same, or substantially the same, thickness as each other. The first semiconductor patterns NS1 at the same level may have the same, or substantially the same, semiconductor material as each other. The second semiconductor patterns NS2 at the same level may be formed from the same semiconductor layer. The second semiconductor patterns NS2 at the same level may have the same, or substantially the same, thickness as each other. The second semiconductor patterns NS2 at the same level may have the same, or substantially the same, semiconductor material as each other. For example, the first and second semiconductor patterns NS1 and NS2 may include one or more of silicon (Si), silicon germanium (SiGe), and germanium (Ge).

The first semiconductor patterns NS1 at different levels may have the same thickness as each other or different thicknesses from each other. The second semiconductor patterns NS2 at different levels may have the same thickness as each other or different thicknesses from each other.

The first source/drain patterns SD1 may be or include epitaxial patterns formed from the first semiconductor patterns NS1 and the first upper pattern UP1 serving as a seed layer. The second source/drain patterns SD2 may be or include epitaxial patterns formed from the second semiconductor patterns NS2 and the second upper pattern UP2 serving as a seed layer. The first source/drain patterns SD1 and the second source/drain patterns SD2 may be formed with a chemical vapor deposition (CVD) process; however, inventive concepts are not limited thereto.

When the first to third transistors TR1 to TR3 are PMOSFETs, the first source/drain patterns SD1 may include a material that provides compressive strain to the first channel pattern CH1. For example, the first source/drain patterns SD1 may include a semiconductor element (e.g., SiGe) whose lattice constant is greater than that of a semiconductor element of the substrate 100. The first source/drain patterns SD1 may be doped with P-type conductive impurities, for example, boron (B).

When the fourth to sixth transistors TR4 to TR6 are NMOSFETs, the second source/drain patterns SD2 may include a material that provides tensile strain to the second channel pattern CH2. For example, the second source/drain patterns SD2 may include a semiconductor element whose lattice constant is less than that of the semiconductor element of the substrate 100. Accordingly a mobility of carriers, e.g. electron mobility, may increase in a channel during operation of the transistor. Alternatively, the second source/drain patterns SD2 may include the same semiconductor element as that of the substrate 100. The second source/drain patterns SD2 may be doped with N-type conductive impurities, for example, phosphorus (P) and/or arsenic (As).

First to sixth gate electrodes GE1 to GE6 may be provided to extend in a first direction D1, while running across the first and second channel patterns CH1 and CH2. The first to sixth gate electrodes GE1 to GE6 may respectively cross over the first to sixth regions RG1 to RG6. The first to sixth gate electrodes GE1 to GE6 may respectively include first to sixth work function patterns WF1 to WF6. The first to sixth gate electrodes GE1 to GE6 may respectively further include first to sixth electrode patterns EL1 to EL6. The first to sixth electrode patterns EL1 to EL6 may be respectively on the first to sixth work function patterns WF1 to WF6. The first to sixth electrode patterns EL1 to EL6 may each have resistance, e.g. a sheet resistance, less than that of each of the first to sixth work function patterns WF1 to WF6. For example, the first to sixth electrode patterns EL1 to EL6 may include one or more low resistance or low resistivity metals such as aluminum (Al), tungsten (W), titanium (Ti), and tantalum (Ta).

The first to third work function patterns WF1 to WF3 of the first to third gate electrodes GE1 to GE3 may respectively fill first to third spaces SP1 to SP3 each between the first semiconductor patterns NS1. The first to third spaces SP1 to SP3 may be positioned between the first semiconductor patterns NS1 on the first to third regions RG1 to RG3, respectively. The fourth to sixth work function patterns WF4 to WF6 of the fourth to sixth gate electrodes GE4 to GE6 may respectively fill fourth to sixth spaces SP4 to SP6 each between the second semiconductor patterns NS2. The fourth to sixth spaces SP4 to SP6 may be positioned between the second semiconductor patterns NS2 on the fourth to sixth regions RG4 to RG6, respectively.

The first to sixth spaces SP1 to SP6 at the same level may have the same, or substantially the same, size as each other. For example, the first to sixth spaces SP1 to SP6 at the same level may have the same length in the third direction D3.

The first to sixth work function patterns WF1 to WF6 of the first to sixth gate electrodes GE1 to GE6 may surround the first and second semiconductor patterns NS1 and NS2 (see FIG. 2C). For example, the first to sixth work function patterns WF1 to WF6 may surround top surfaces, bottom surfaces, and sidewalls of the first and second semiconductor patterns NS1 and NS2. In this sense, each of the first to sixth transistors TR1 to TR6 may be a gate-all-around field effect transistor.

The first to third electrode patterns EL1 to EL3 of the first to third gate electrodes GE1 to GE3 may not respectively fill the first to third spaces SP1 to SP3. The first to third electrode patterns EL1 to EL3 may be spaced apart from the first semiconductor patterns NS1 across the first to third work function patterns WF1 to WF3. The fourth to sixth electrode patterns EL4 to EL6 of the fourth to sixth gate electrodes GE4 to GE6 may not respectively fill the fourth to sixth spaces SP4 to SP6. The fourth to sixth electrode patterns EL4 to EL6 may be spaced apart from the second semiconductor patterns NS2 across the fourth to sixth work function patterns WF4 to WF6.

A pair of gate spacers GS may be on opposite sidewalls of each of the first to sixth gate electrodes GE1 to GE6. The gate spacers GS may extend in the first direction D1 along the first to sixth gate electrodes GE1 to GE6. The gate spacers GS may have top surfaces higher than those of the first to sixth gate electrodes GE1 to GE6. The first to sixth work function patterns WF1 to WF6 on the first and second channel patterns CH1 and CH2 may extend in the third direction D3 along inner walls of the gate spacers GS. For example, the gate spacers GS may include one or more of SiCN, SiCON, and SiN. Alternatively, the gate spacers GS may include a multi-layer consisting of two or more of SiCN, SiCON, and SiN.

Gate capping layers CP may be on the first to sixth gate electrodes GE1 to GE6. The gate capping layers CP may extend in the first direction D1 along the first to sixth gate electrodes GE1 to GE6. The gate capping layers CP may have top surfaces coplanar with those of the gate spacers GS. The gate capping layers CP may include a material having an etch selectivity to a first interlayer dielectric layer 110, which will be discussed below. For example, the gate capping layers CP may include one or more of SiON, SiCN, SiCON, and SiN.

Barrier insulation patterns BP may be between the first and second source/drain patterns SD1 and SD2 and the first to sixth gate electrodes GE1 to GE6. The barrier insulation patterns BP may be either between the first semiconductor patterns NS1 vertically spaced apart from each other or between the second semiconductor patterns NS2 vertically spaced apart from each other. The barrier insulation patterns BP may electrically insulate the first to sixth gate electrodes GE1 to GE6 from the first and second source/drain patterns SD1 and SD2. The first to third spaces SP1 to SP3 may be defined by a pair of barrier insulation patterns BP horizontally adjacent to each other and a pair of the first semiconductor patterns NS1 vertically adjacent to each other, and the fourth to sixth spaces SP4 to SP6 may be defined by a pair of the barrier insulation patterns BP horizontally adjacent to each other and a pair of the second semiconductor patterns NS2 vertically adjacent to each other. The barrier insulation patterns BP may include, for example, a silicon nitride layer.

An interface layer IL may be provided to surround each of the first and second semiconductor patterns NS1 and NS2. The interface layers IL may cover, e.g. directly cover, the first and second semiconductor patterns NS1 and NS2. The interface layers IL may include, for example, a silicon oxide layer.

Gate dielectric layers GI may be between the first and second semiconductor patterns NS1 and NS2 and the first to sixth gate electrodes GE1 to GE6. Each of the gate dielectric layers GI may conformally fill a portion of a corresponding one of the first to sixth spaces SP1 to SP6. The gate dielectric layers GI may include a high-k dielectric material whose dielectric constant is greater than that of a silicon oxide layer. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

When the first to third transistors TR1 to TR3 are PMOSFETs, the second transistor TR2 may have a threshold voltage greater than, e.g. greater in absolute value than, that of the first transistor TR1, and the third transistor TR3 may have a threshold voltage greater than, e.g. greater in absolute value than, that of the second transistor TR2.

The first work function pattern WF1 of the first transistor TR1 may include a first work function metal layer W1. The second work function pattern WF2 of the second transistor TR2 may include a same, or substantially, same first work function metal layer W1. In some embodiments, the material included in the first work function pattern WF1 may be the same, or substantially the same, as that included in the second work function pattern WF2. The first work function metal layer W1 may be or may include a metal nitride layer having a relatively high work function. For example, the first work function metal layer W1 may be a titanium nitride (TiN) layer or a titanium oxynitride (TiON) layer.

A work function control liner CL may be between the second work function pattern WF2 and the first semiconductor patterns NS1. The work function control liner CL may generate a dipole, and thus a threshold voltage of the second transistor TR may be increased due to variation in energy band caused by the dipole. The work function control liner CL may include a high-k dielectric material whose dielectric constant is greater than that of a silicon oxide layer. For example, the work function control liner CL may include metal oxide such as lanthanum oxide or aluminum oxide.

Even though the first and second work function patterns WF1 and WF2 have only the same first work function metal layer W1, the work function control liner CL may cause the second transistor TR2 to have a threshold voltage greater than, e.g. greater in absolute value than, that of the first transistor TR1.

The third work function pattern WF3 of the third transistor TR3 may include a first work function metal layer W1, a second work function metal layer W2, and other first work function metal layer W1 sequentially stacked on the first semiconductor pattern NS1. In the third space S3, the second work function metal layer W2 may have a thickness greater than that of each of the first work function metal layers W1. The second work function metal layer W2 may be a metal nitride layer whose work function is less than that of the first work function metal layer W1. For example, the second work function metal layer W2 may be a silicon-doped titanium nitride (TiSiN) layer, a silicon-doped tantalum nitride (TaSiN) layer, an aluminum-doped titanium nitride (TiAlN) layer, or an aluminum-doped tantalum nitride (TaAlN) layer.

The work function of the second work function metal layer W2 may be altered by controlling a concentration of dopants such as silicon and/or aluminum. In this sense, the third work function pattern WF3 may be controlled in work function by adjustment of an impurity concentration in the second work function metal layer W2. For example, the second work function metal layer W2 may have an impurity concentration (e.g., a silicon and/or aluminum concentration) in a range from about 10 at % to about 30 at %.

The first to third spaces SP1 to SP3 filled with the first to third work function patterns WF1 to WF3 may have the same, or substantially the same, size as each other. Accordingly, the first to third work function patterns WF1 to WF3 filled between the first semiconductor patterns NS1 may have the same, or substantially the same, thickness (e.g., a length in the third direction D3 of the first to third work function patterns WF1 to WF3). In some embodiments, the work function control liner CL may be employed to cause the first to third work function patterns WF1 to WF3 to have different work functions from each other. Alternatively or additionally, a combination of a plurality of work function metal layers may be employed to cause the first to third work function patterns WF1 to WF3 to have different work functions from each other. In certain embodiments, the second work function metal layer W2 may be controlled in doping concentration to cause the first to third work function patterns WF1 to WF3 to have different work functions from each other.

When the fourth to sixth transistors TR4 to TR6 are NMOSFETs, the fifth transistor TR5 may have a threshold voltage greater than that of the fourth transistor TR4, and the sixth transistor TR6 may have a threshold voltage greater than that of the fifth transistor TR5.

The fourth work function pattern WF4 of the fourth transistor TR4 may include a first work function metal layer W1 and a third work function metal layer W3 stacked, e.g. sequentially stacked, on the second semiconductor pattern NS2. The fifth work function pattern WF5 of the fifth transistor TR5 may include a first work function metal layer W1 and a third work function metal layer W3 sequentially stacked on the second semiconductor pattern NS2. For example, the material included in the fourth work function pattern WF4 may be the same, or substantially the same, as that included in the fifth work function pattern WF5. The third work function metal layer W3 may be or include a work function metal layer used in an NMOSFET, and may be or include a metal layer having a relatively low work function. For example, the third work function metal layer W3 may be or include a TiAlC layer.

A work function control liner CL may be between the fourth work function pattern WF4 and the second semiconductor patterns NS2. The work function control liner CL of the fourth transistor TR4 may be the same, or substantially the same, as the work function control liner CL of the second transistor TR discussed above. The work function control liner CL of the fourth transistor TR may generate a dipole, and in contrast to the PMOSFET, the fourth transistor TR4 as the NMOSFET may decrease in threshold voltage.

In conclusion, even though all of the fourth and fifth work function patterns WF4 and WF5 have only the same first and third work function metal layers W1 and W3, the work function control liner CL may cause the fifth transistor TR5 to have a threshold voltage greater than that of the fourth transistor TR4.

The sixth work function pattern WF6 of the sixth transistor TR6 may include a first work function metal layer W1, a second work function metal layer W2, other first work function metal layer W1, and a third work function metal layer W3 sequentially stacked on the second semiconductor pattern NS2. The second work function metal layer W2 of the sixth work function pattern WF6 may have a thickness less than that of the second work function metal layer W2 of the third work function pattern WF3. A combination of work function metal layers W1, W2, W1, and W3 may be employed to cause the sixth work function pattern WF6 to have a work function different from those of the fourth and fifth work function patterns WF4 and WF5. As a result, the sixth transistor TR6 may have a threshold voltage greater than that of the fifth transistor TR5.

Optionally or additionally, a work function control liner CL may be between the sixth work function pattern WF6 and the second semiconductor patterns NS2. The work function control liner CL may prevent the sixth transistor TR6 from excessively increasing its threshold voltage.

A first interlayer dielectric layer 110 may be provided on an entire surface of the substrate 100. The first interlayer dielectric layer 110 may cover, e.g. directly cover, the device isolation layer ST, the first to sixth gate electrodes GE1 to GE6, and the first and second source/drain patterns SD1 and SD2. The first interlayer dielectric layer 110 may have a top surface coplanar, or substantially coplanar, with those of the gate capping layers GP. For example, the first interlayer dielectric layer 110 may include a silicon oxide layer or a silicon oxynitride layer.

Although not shown, contacts may be provided to penetrate the first interlayer dielectric layer 110 to come into contact with the first and second source/drain patterns SD1 and SD2. The contacts may include a metallic material such as Ti, W, and Ta.

Figure 10A:
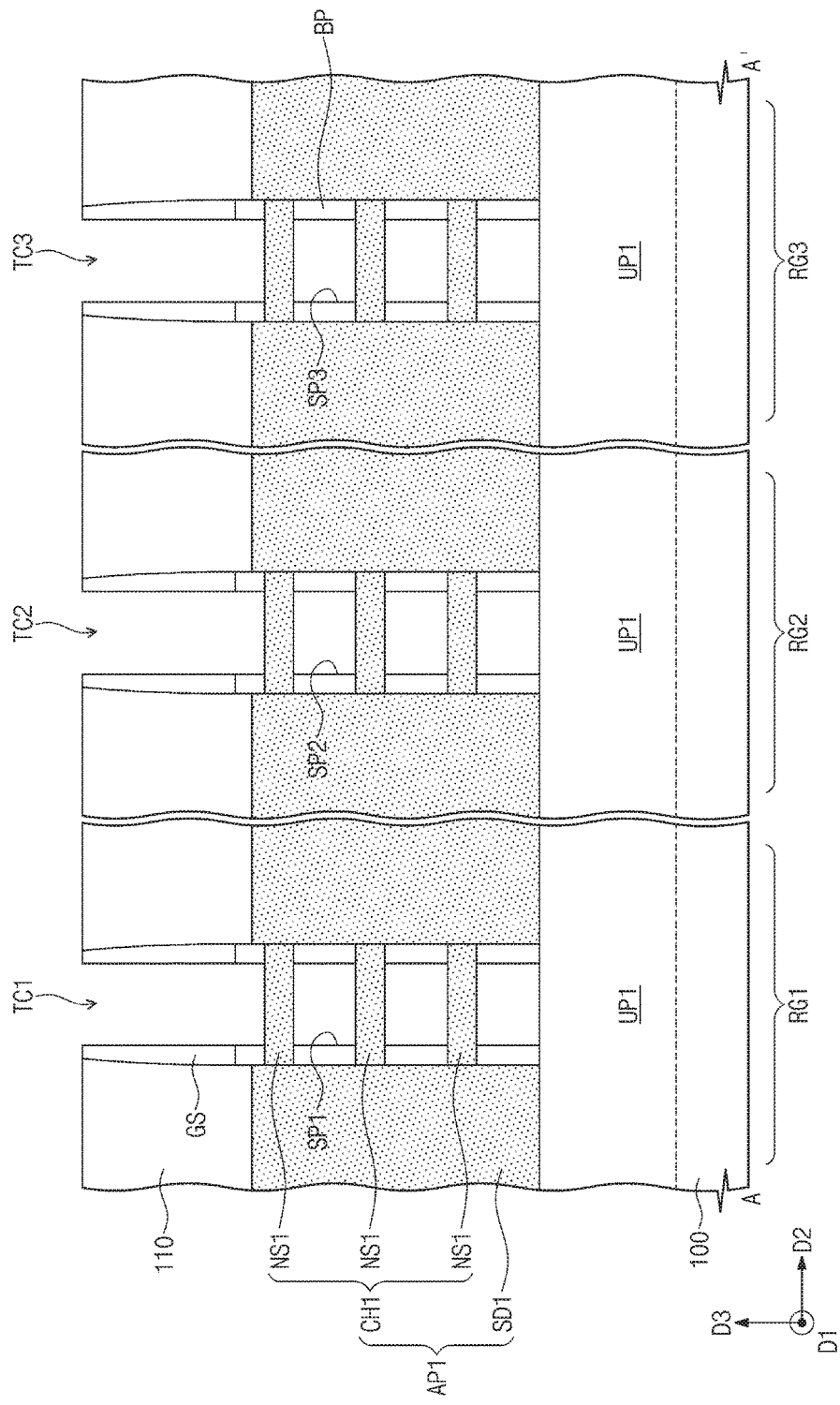
Figure 10B:
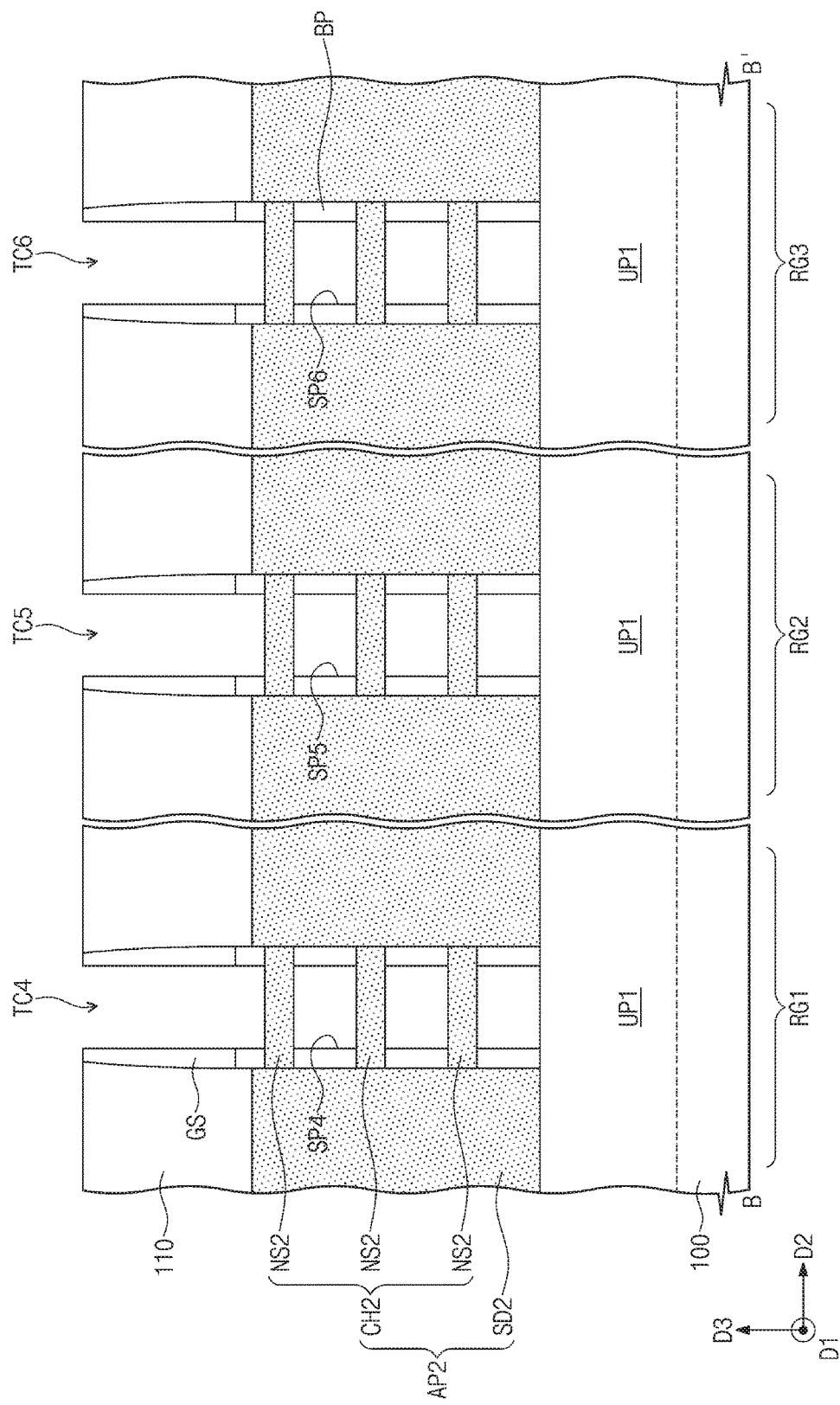
Figure 10C:
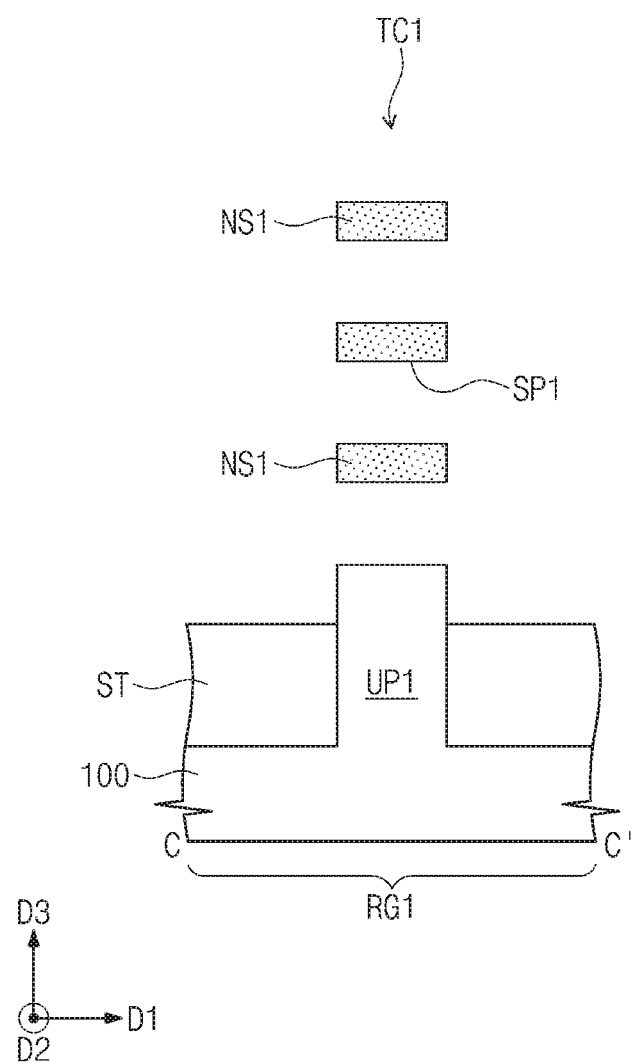
FIG. 10C illustrates a cross-sectional view taken along line C-C' of FIG. 9.
Figure 10D:
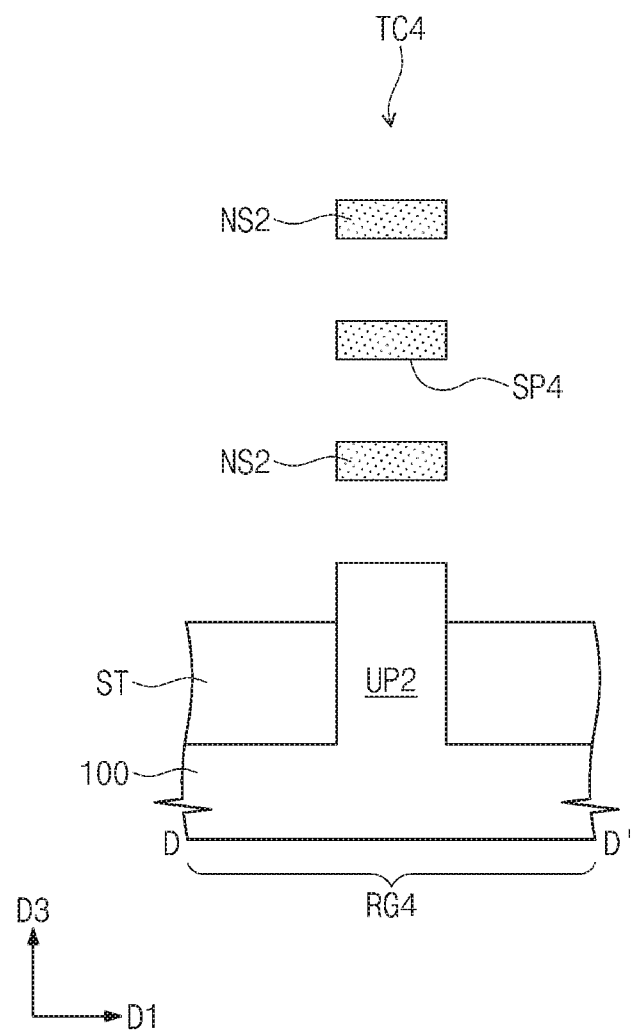
FIG. 10D illustrates a cross-sectional view taken along line D-D' of FIG. 9.

FIGS. 3, 5, 7, and 9 illustrate plan views showing a method of manufacturing a semiconductor device according to some example embodiments of inventive concepts. FIGS. 4A, 6A, 8A, and 10A illustrate cross-sectional views taken along line A-A' of FIGS. 3, 5, 7, and 9, respectively. FIGS. 4B, 6B, 8B, and 10B illustrate cross-sectional views taken along line B-B' of FIGS. 3, 5, 7, and 9, respectively. FIG. 10C illustrates a cross-sectional view taken along line C-C' of FIG. 9. FIG. 10D illustrates a cross-sectional view taken along line D-D' of FIG. 9. FIGS. 11 to 14 illustrate cross-sectional views showing a method of forming first to third gate electrodes according to some example embodiments of inventive concepts.

Figure 3:
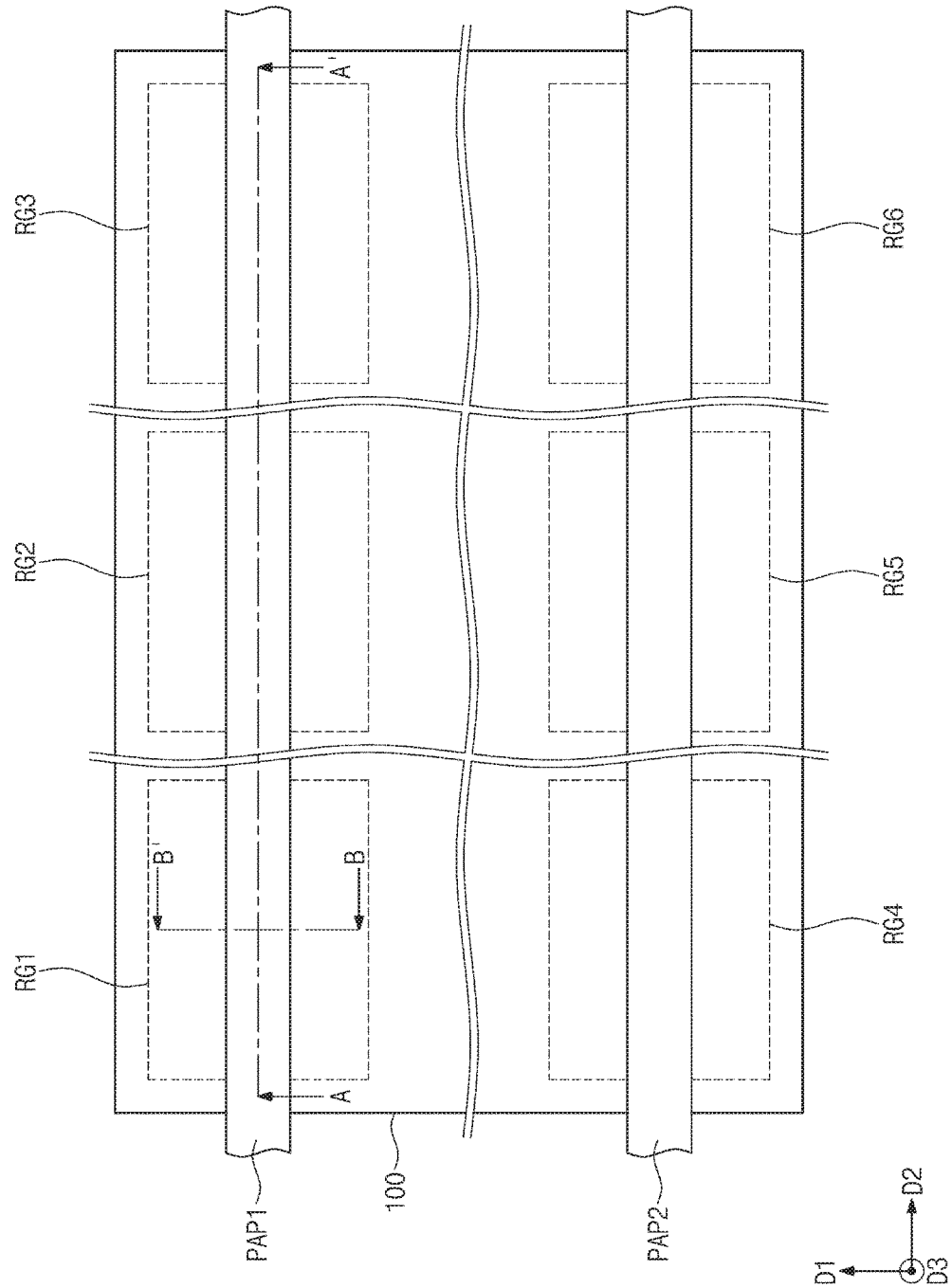
FIGS. 3, 5, 7, and 9 illustrate plan views showing a method of manufacturing a semiconductor device according to some example embodiments of inventive concepts.
Figure 4B:
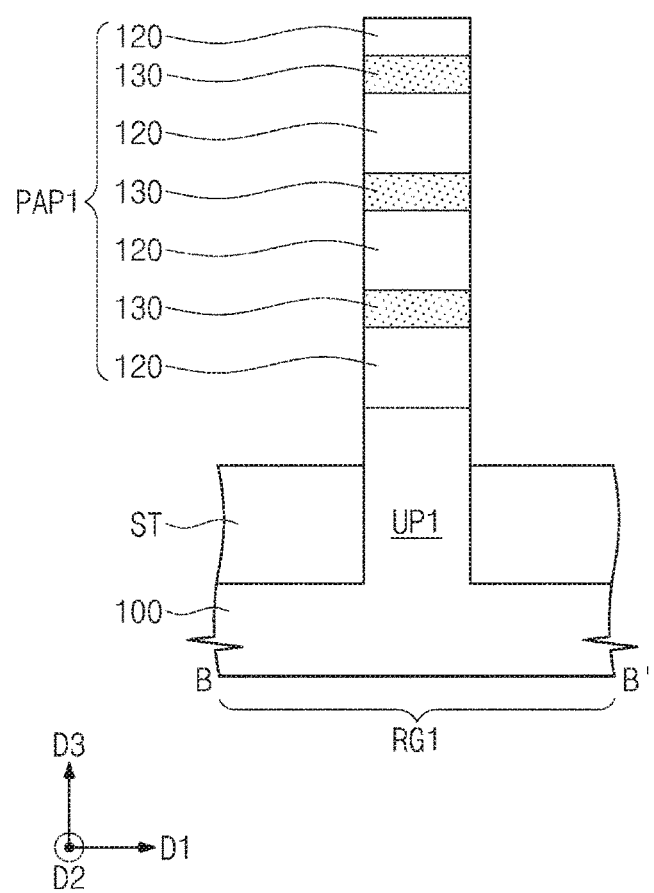
FIGS. 4B, 6B, 8B, and 10B illustrate cross-sectional views taken along line B-B' of FIGS. 3, 5, 7, and 9, respectively.

Referring to FIGS. 3, 4A, and 4B, sacrificial layers 120 and semiconductor layers 130 may be alternately and repeatedly stacked on an entire surface of a substrate 100. The semiconductor layers 130 may be repeatedly stacked three times, but inventive concepts are not limited thereto. In some embodiments, the sacrificial layers 120 may include a material having an etch selectivity to the semiconductor layers 130. For example, the semiconductor layers 130 may include a material that is not etched in a process where the sacrificial layers 120 are etched. Specifically, in the process where the sacrificial layers 120 are etched, an etch rate ratio of the sacrificial layers 120 to the semiconductor layers 130 may fall within a range from about 10:1 to about 200:1. For example, the sacrificial layers 120 may include SiGe or Ge, and the semiconductor layers 130 may include Si.

The sacrificial layers 120 and the semiconductor layers 130 may be formed by an epitaxial growth process in which the substrate 100 is used as a seed layer. The sacrificial layers 120 and the semiconductor layers 130 may be successively formed in the same chamber, for example, the same CVD chamber. The sacrificial layers 120 and the semiconductor layers 130 may be conformally formed on the entire surface of the substrate 100.

The sacrificial layers 120, the semiconductor layers 130, and the substrate 100 may be patterned to form a first preliminary active pattern PAP1 and a second preliminary active pattern PAP2. The patterning process may also etch an upper portion of the substrate 100 to form first and second upper patterns UP1 and UP2. The first and second preliminary active patterns PAP1 and PAP2 may be respectively on the first and second upper patterns UP1 and UP2. The first and second preliminary active patterns PAP1 and PAP2 may have a linear or bar shape extending in a second direction D2.

When the upper portion of the substrate 100 is etched by the patterning process, trenches may be formed on opposite sides of each of the first and second upper patterns UP1 and UP2. A device isolation layer ST may be formed to fill the trenches. The formation of the device isolation layer ST may include forming an insulation layer on the entire surface of the substrate 100 and recessing the insulation layer until the first and second preliminary active patterns PAP1 and PAP2 are completely exposed. Accordingly, the device isolation layer ST may have a top surface lower than those of the first and second upper patterns UP1 and UP2.

Figure 5:
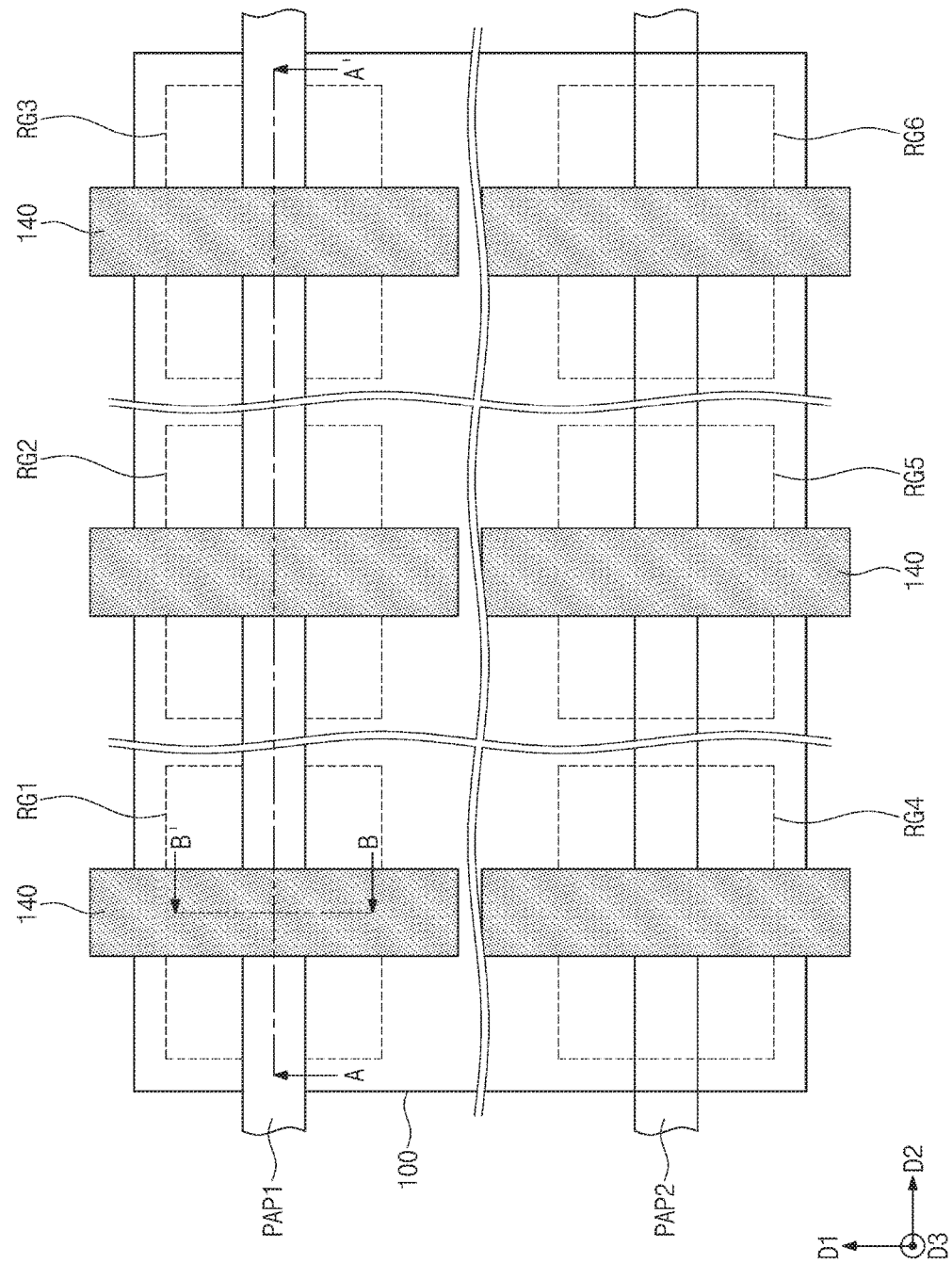
Figure 6B:
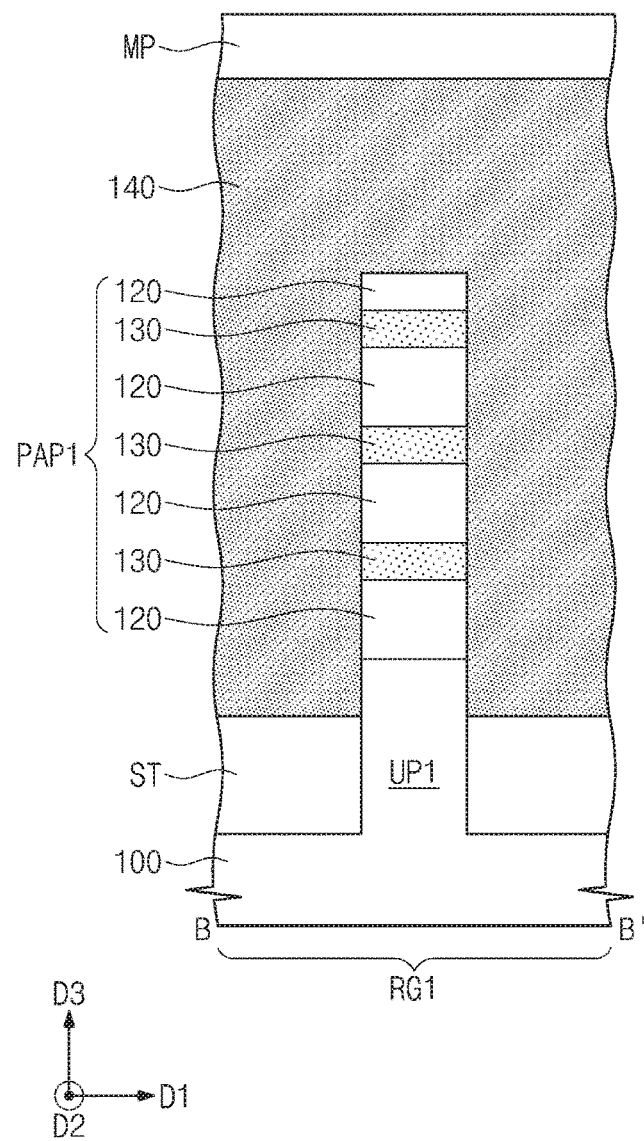

Referring to FIGS. 5, 6A, and 6B, sacrificial gate patterns 140 may be formed to run across the first and second preliminary active patterns PAP1 and PAP2. The sacrificial gate patterns 140 may be formed to have a linear or bar shape extending in a first direction D1. Gate mask patterns MP may correspondingly be formed on the sacrificial gate patterns 140. The formation of the sacrificial gate patterns 140 and the gate mask patterns MP may include sequentially forming on the substrate 100 a sacrificial gate layer and a gate mask layer, and sequentially patterning the gate mask layer and the sacrificial gate layer. The sacrificial gate layer may include polysilicon. The gate mask layer may include a silicon nitride layer and/or a silicon oxynitride layer.

A pair of gate spacers GS may be formed on opposite sidewalls of each of the sacrificial gate patterns 140. For example, the gate spacers GS may include one or more of SiCN, SiCON, and SiN. The formation of the gate spacers GS may include forming a spacer layer by a deposition process such as CVD or atomic layer deposition (ALD) and performing an anisotropic etching process on the spacer layer.

Figure 7:
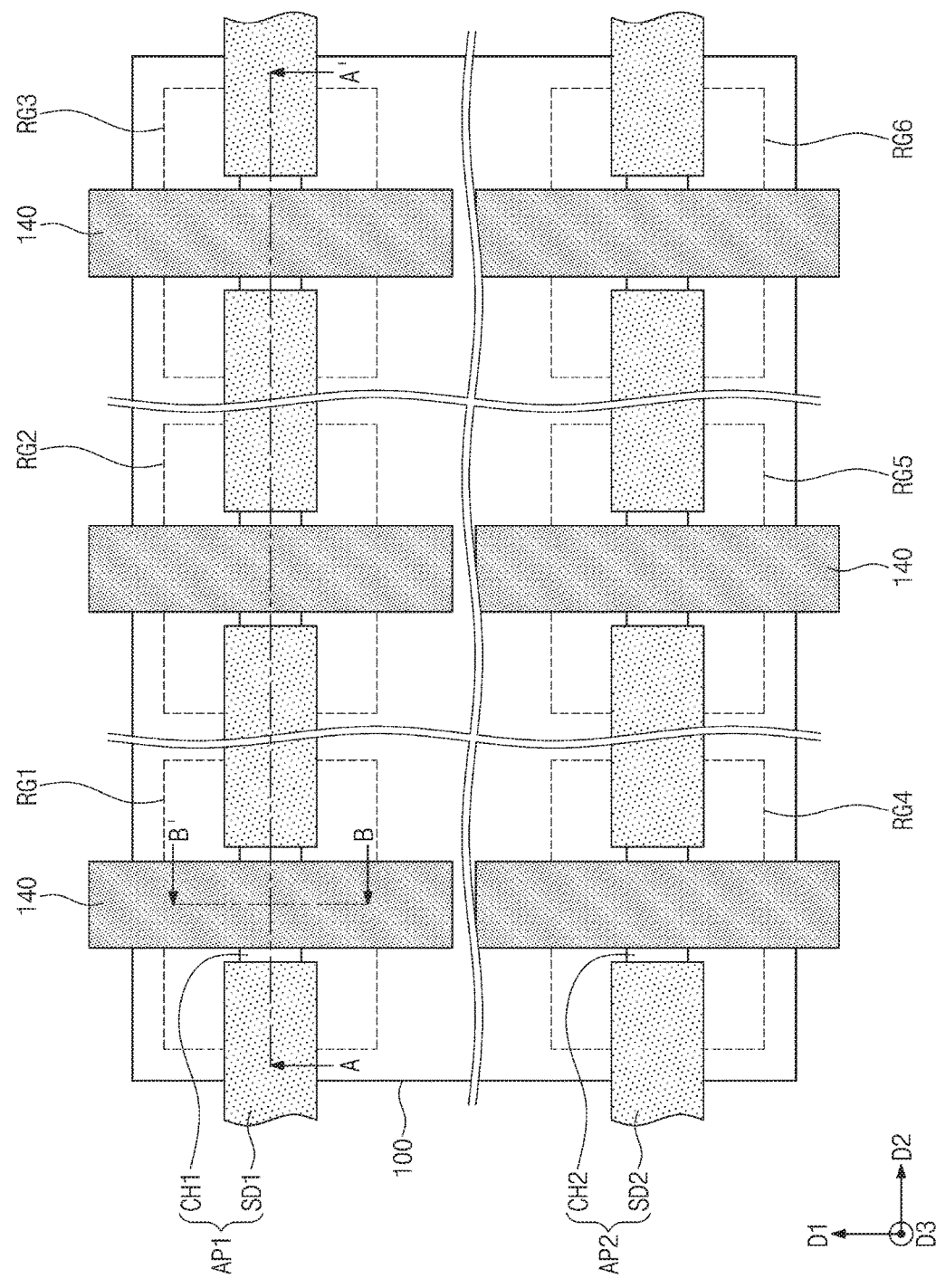
Figure 8A:
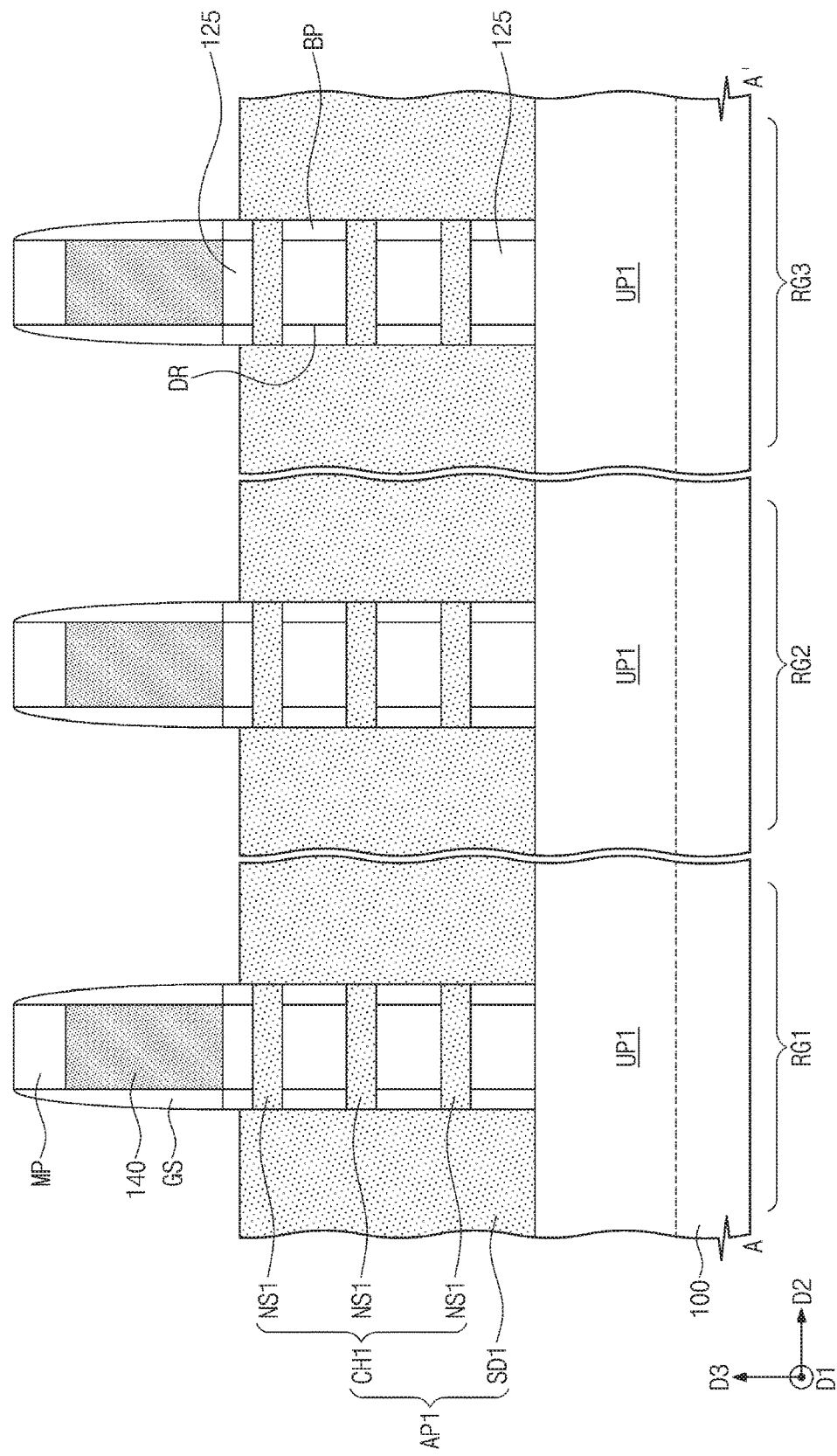
Figure 8B:
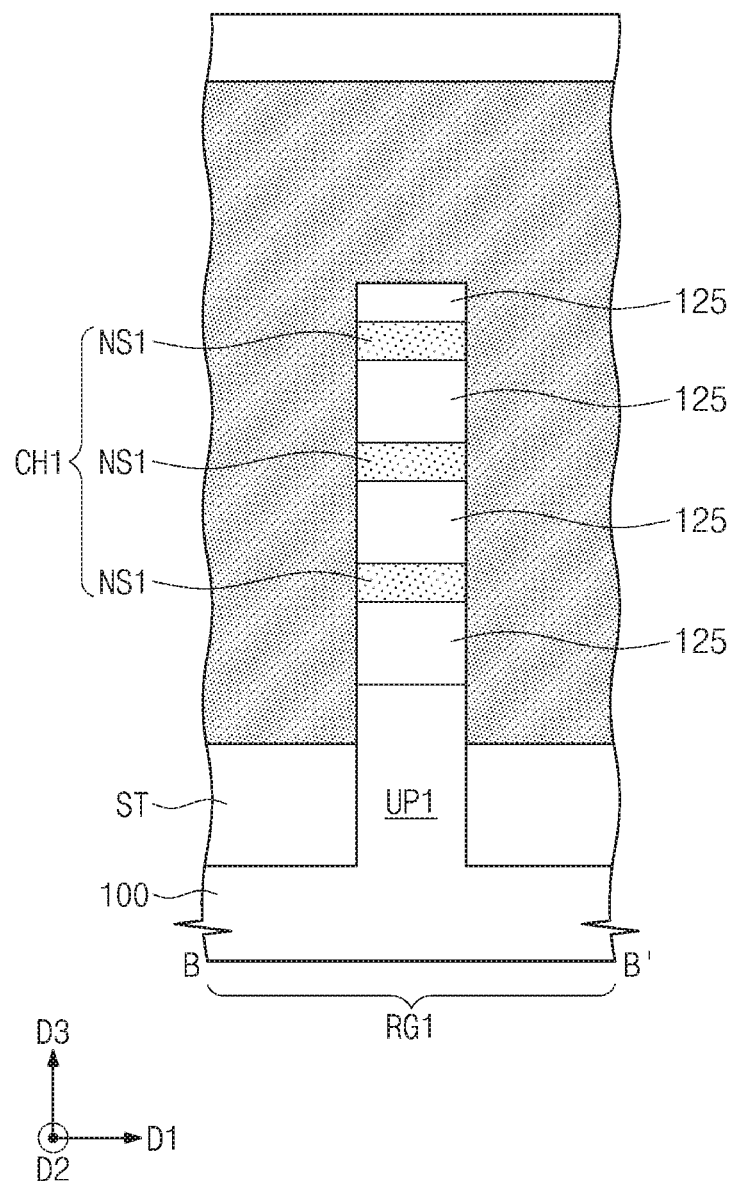
Figure 9:
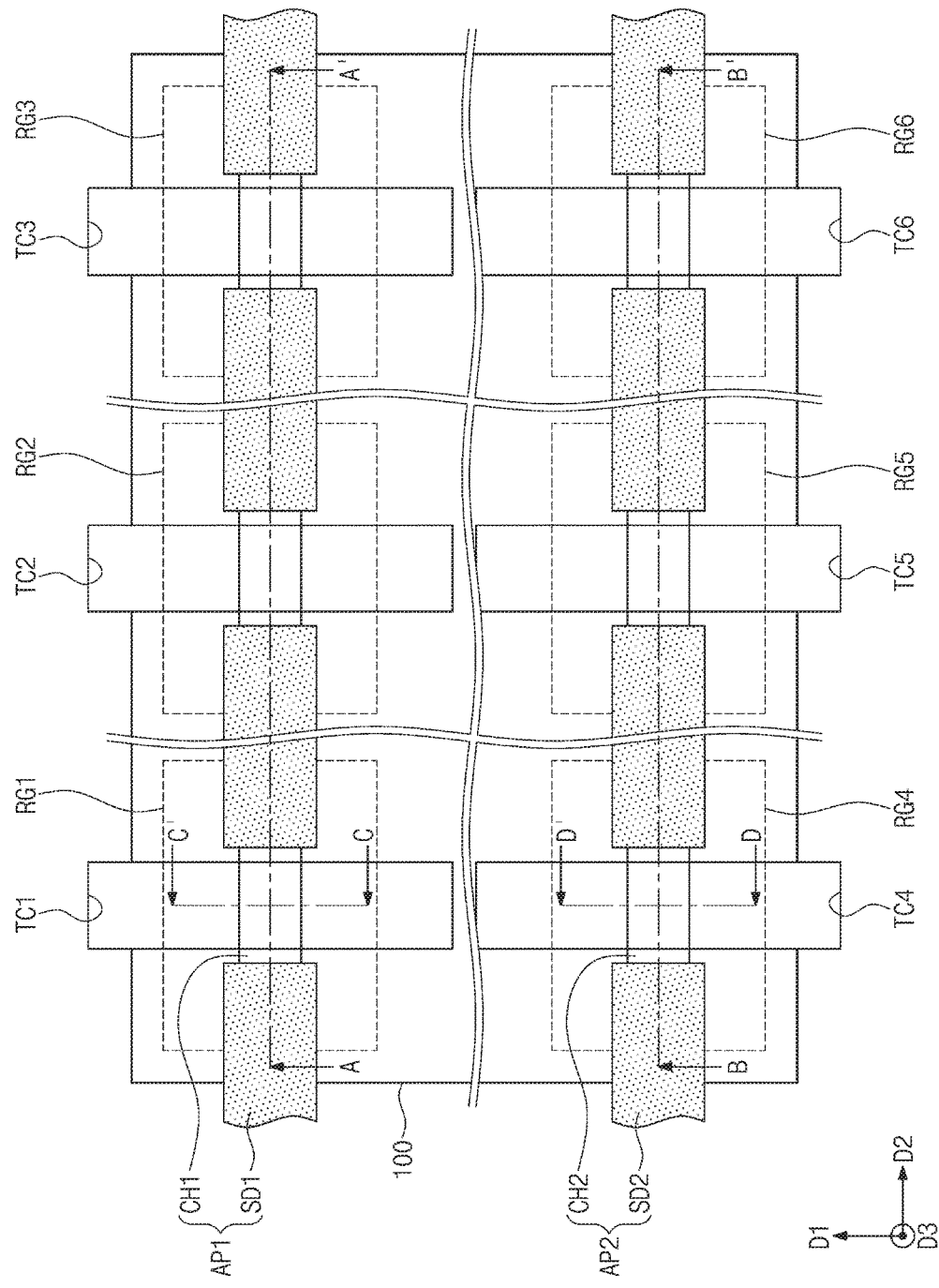

Referring to FIGS. 7, 8A, and 8B, the first and second preliminary active patterns PAP1 and PAP2 may be patterned to respectively form first and second channel patterns CH1 and CH2. The first and second preliminary active patterns PAP1 and PAP2 may be patterned using the gate mask patterns MP and the gate spacers GS as an etching mask. The first and second upper patterns UP1 and UP2 may therefore be partially exposed through the gate mask patterns MP and the gate spacers GS.

For example, the sacrificial layers 120 of the first and second preliminary active patterns PAP1 and PAP2 may be patterned to form sacrificial patterns 125. The semiconductor layers 130 of the first and second preliminary active patterns PAP1 and PAP2 may be patterned to form first and second semiconductor patterns NS1 and NS2. The first semiconductor patterns NS1 may be included in the first channel pattern CH1, and the second semiconductor patterns NS2 may be included in the second channel pattern CH2.

After the patterning process, exposed portions of the sacrificial patterns 125 may be horizontally removed to form depression regions DR. The formation of the depression regions DR may include performing an etching process using an etch source that exhibits an etch selectivity to the sacrificial patterns 125. The etching process may include a wet etching process. For example, when the first and second semiconductor patterns NS1 and NS2 include Si, and when the sacrificial patterns 125 include SiGe, the formation of the depression regions DR may include performing an etching process with an etchant including peracetic acid.

Barrier insulation patterns BP may be formed to fill the depression regions DR. The barrier insulation patterns BP may be vertically spaced apart from each other across the first and second semiconductor patterns NS1 and NS2. For example, a barrier insulation layer may be conformally formed on the entire surface of the substrate 100. The barrier insulation layer may fill the depression regions DR. After that, the barrier insulation layer may be etched until the barrier insulation patterns BP remain locally in the depression regions DR.

First source/drain patterns SD1 may be formed on opposite sides of each of the first channel patterns CH1. Second source/drain patterns SD2 may be formed on opposite sides of each of the second channel patterns CH2.

For example, a selective epitaxial process may be performed using the first semiconductor patterns NS1 and the first upper pattern UP1 as a seed layer, thereby forming the first source/drain patterns SD1. The first channel patterns CH1 and the first source/drain patterns SD1 may be connected to each other to be included in a first active pattern AP1 extending in the second direction D2. The first source/drain patterns SD1 may be formed of a material that provides compressive strain to the first channel patterns CH1. For example, the first source/drain patterns SD1 may include SiGe whose lattice constant is greater than that of Si. Accordingly a mobility of carriers, e.g. hole mobility, may increase in a channel during operation of the transistor. Simultaneously during or after the selective epitaxial process, the first source/drain patterns SD1 may be doped with P-type impurities, for example, boron (B).

A selective epitaxial process may be performed using the second semiconductor patterns NS2 and the second upper pattern UP2 as a seed layer, thereby forming the second source/drain patterns SD2. The second channel patterns CH2 and the second source/drain patterns SD2 may be connected to each other to be included in a second active pattern AP2 extending in the second direction D2. For example, the second source/drain patterns SD2 may be formed of Si. Simultaneously during or after the selective epitaxial process, the second source/drain patterns SD2 may be doped with N-type impurities, for example, phosphorus (P) and/or arsenic (As).

Referring to FIGS. 9 and 10A to 10D, a first interlayer dielectric layer 110 may be formed on the entire surface of the substrate 100. Thereafter, a planarization process may be performed on the first interlayer dielectric layer 110 until top surfaces of the sacrificial gate patterns 140 are exposed. The planarization process may include an etch-back process and/or a chemical mechanical polishing (CMP) process. When the first interlayer dielectric layer 110 is planarized, the gate mask patterns MP may also be removed. For example, the first interlayer dielectric layer 110 may be formed of a silicon oxide layer or a silicon oxynitride layer.

The planarization process may selectively remove the exposed sacrificial gate patterns 140. As the sacrificial gate patterns 140 are removed, first to sixth trenches TC1 to TC6 may be respectively formed on first to sixth regions RG1 to RG6 of the substrate 100. The first to sixth trenches TC1 to TC6 may expose the first and second channel patterns CH1 and CH2. The first to sixth trenches TC1 to TC6 may also expose the sacrificial patterns 125.

The exposed sacrificial patterns 125 may be selectively removed, for example, with a wet etching process. For example, when the sacrificial patterns 125 include SiGe, and when the first and second semiconductor patterns NS1 and NS2 include Si, the selective etching process may be performed using an etchant including peracetic acid. The etchant may further include a hydrofluoric acid (HF) solution and a deionized water. The first and second source/drain patterns SD1 and SD2 may be covered with the barrier insulation patterns BP and the first interlayer dielectric layer 110, and may thereby be protected from the etching process.

The sacrificial patterns 125 may be removed to form first to sixth spaces SP1 to SP6 on the first to sixth regions RG1 to RG6. The first to sixth spaces SP1 to SP6 may be respectively spatially connected to the first to sixth trenches TC1 to TC6 to expose the first and second semiconductor patterns NS1 and NS2.

Referring back to FIGS. 1 and 2A to 2D, first to sixth gate electrodes GE1 to GE6 may be respectively formed in the first to sixth trenches TC1 to TC6. The formation of the first to sixth gate electrodes GE1 to GE6 will be discussed below with reference to FIGS. 11 to 14. Gate capping layers CP may be formed on the first to sixth gate electrodes GE1 to GE6. For example, the gate capping layers CP may include one or more of SiON, SiCN, SiCON, and SiN. Although not shown, contacts may be formed to penetrate the first interlayer dielectric layer 110 to come into contact with the first and second source/drain patterns SD1 and SD2.

The formation of the first to sixth gate electrodes GE1 to GE6 in the first to sixth trenches TC1 to TC6 will be discussed below with reference to FIGS. 11 to 14. The formation of the first to third gate electrodes GE1 to GE3 will be representatively described below.

Figure 11:
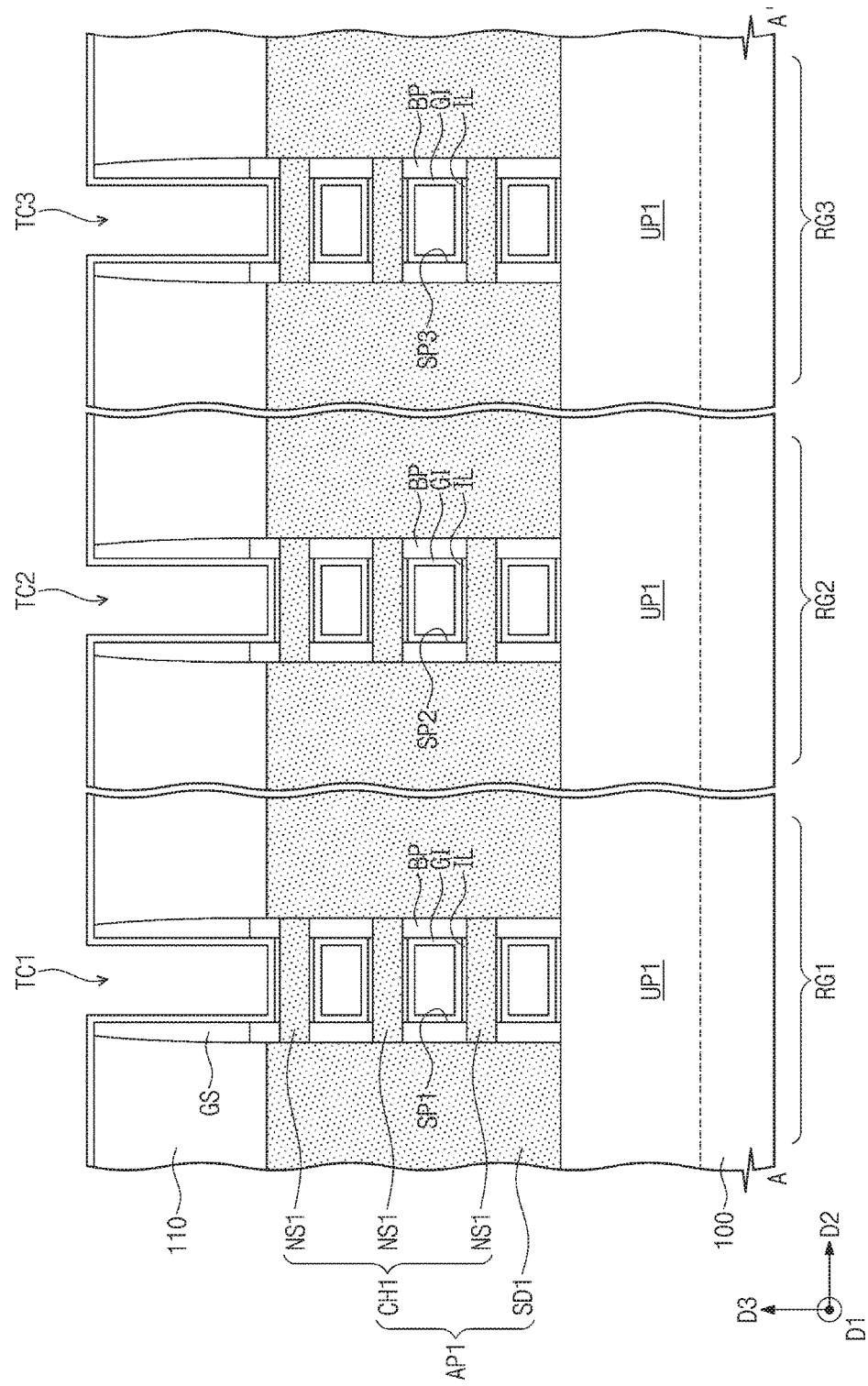
FIGS. 11 to 14 illustrate cross-sectional views showing a method of forming first to third gate electrodes according to some example embodiments of inventive concepts.

Referring to FIG. 11, an oxidation process using plasma may be performed on the first semiconductor patterns NS1 exposed to the first to third trenches TC1 to TC3, and therefore interface layers IL may be grown from the exposed first semiconductor patterns NS1. The interface layers IL may surround, e.g. directly surround, surfaces of the exposed first semiconductor patterns NS1.

The formation of the interface layer IL may include a thermal oxidation process and/or a chemical oxidation process. The oxidation process may use one or more of oxygen plasma, ozone plasma, and vapor plasma. The interface layers IL may include, for example, a silicon oxide layer.

Gate dielectric layers GI may be conformally formed on the interface layers IL. The gate dielectric layers GI may partially fill the first to third spaces SP1 to SP3 of the first to third trenches TC1 to TC3. The gate dielectric layers GI may directly cover the barrier insulation patterns BP and the interface layers IL. The gate dielectric layers GI may be formed using a high-k dielectric material whose dielectric constant is greater than that of a silicon oxide layer.

Figure 12:
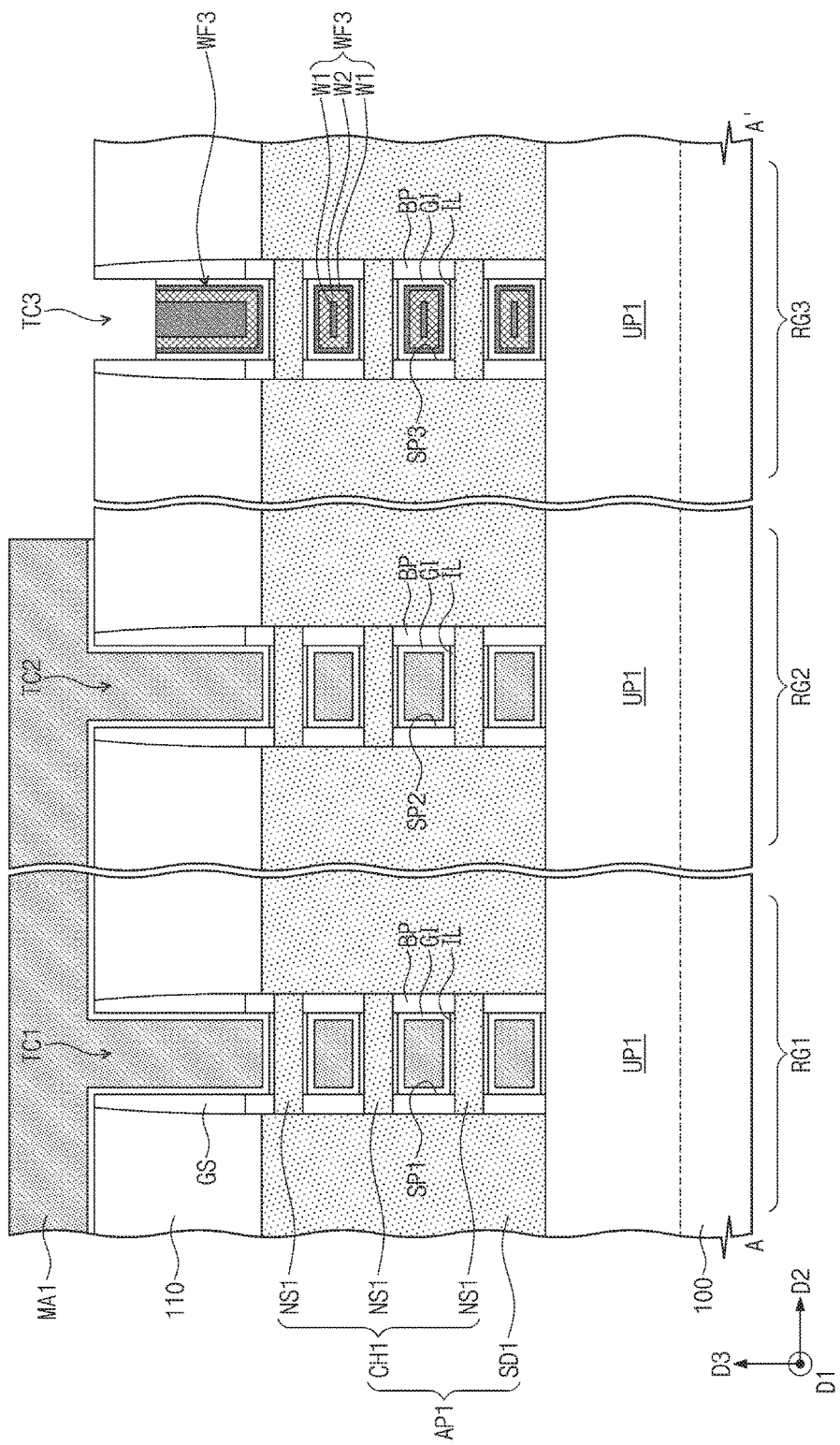

Referring to FIG. 12, a first mask pattern MA1 may be formed on the first and second regions RG1 and RG2. The first mask pattern MA1 may selectively expose the third region RG3. The first mask pattern MA1 may fill, e.g. completely fill, the first and second trenches TC1 and TC2. The first mask pattern MA1 may not fill the third trench TC3.

A third work function pattern WF3 may be formed in the third trench TC3 selectively exposed through the first mask pattern MA1. The third work function pattern WF3 may be formed to completely fill the third space SP3 of the third trench TC3.

The formation of the third work function pattern WF3 may include conformally forming a first work function metal layer W1 in the third trench TC3, conformally forming a second work function metal layer W2 in the third trench TC3, conformally forming other first work function metal layer W1 in the third trench TC3, and recessing upper portions of the first and second work function metal layers W1 and W2. The first and second work function metal layers W1 and W2 may be formed by a deposition process such as ALD. The first work function metal layer W1 may be or include a metal nitride layer having a relatively higher work function, and the second work function metal layer W2 may be or include a metal nitride layer having a relatively lower work function that that of the first work function metal layer W1.

Figure 13:
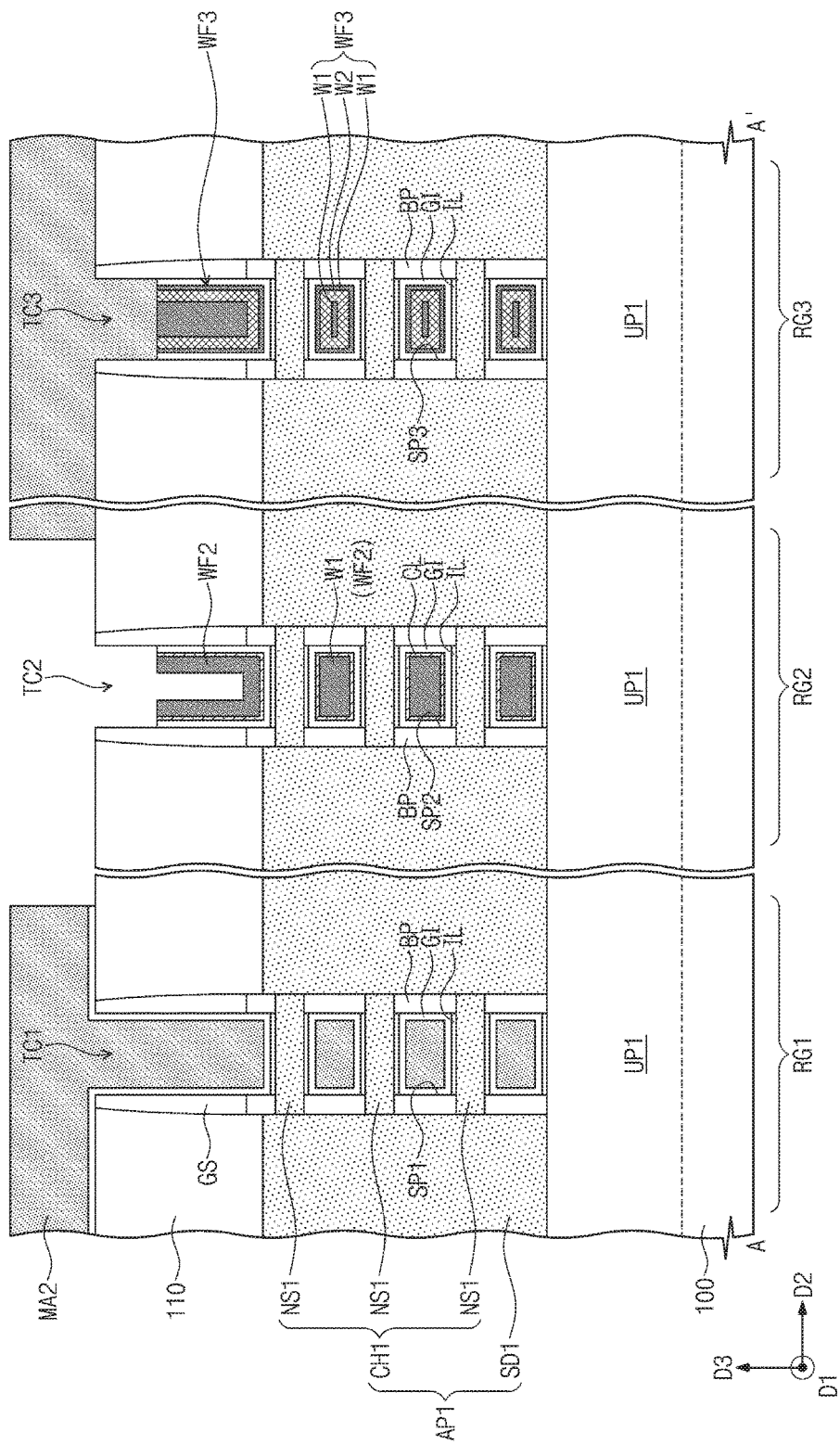

Referring to FIG. 13, the first mask pattern MA1 may be removed. A second mask pattern MA2 may be formed on the first and third regions RG1 and RG3. The second mask pattern MA2 may selectively expose the second region RG2. The second mask pattern MA2 may fill, e.g. completely fill, the first and third trenches TC1 and TC3. The second mask pattern MA2 may not fill the second trench TC2.

A work function control liner CL and a second work function pattern WF2 may be sequentially formed in the second trench TC2 selectively exposed through the second mask pattern MA2. The second work function pattern WF2 may be formed to fill, e.g. completely fill, the second space SP2 of the second trench TC2.

The work function control liner CL may be conformally formed by a deposition process such as ALD. The work function control liner CL may be formed using a high-k dielectric material whose dielectric constant is greater than that of a silicon oxide layer. The formation of the second work function pattern WF2 may include conformally forming a first work function metal layer W1 in the second trench TC2 and recessing an upper portion of the first work function metal layer W1.

Figure 14:
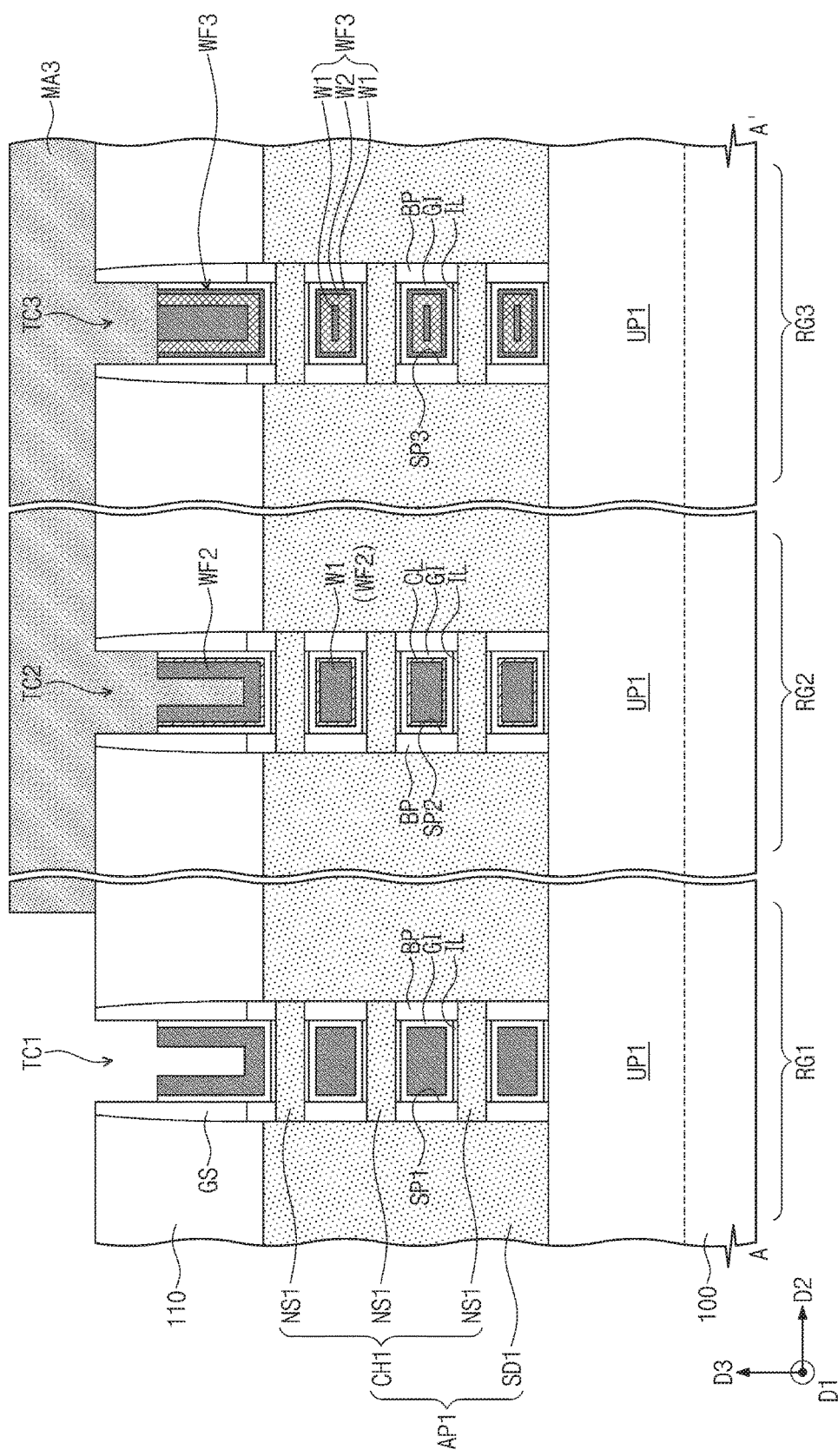

Referring to FIG. 14, the second mask pattern MA2 may be removed. A third mask pattern MA3 may be formed on the second and third regions RG2 and RG3. The third mask pattern MA3 may selectively expose the first region RG1. The third mask pattern MA3 may fill, e.g. completely fill, the second and third trenches TC2 and TC3. The third mask pattern MA3 may not fill the first trench TC1.

A first work function pattern WF1 may be formed in the first trench TC1 selectively exposed through the third mask pattern MA3. The first work function pattern WF1 may be formed to completely fill the first space SP1 of the first trench TC1. The formation of the first work function pattern WF1 may include conformally forming a first work function metal layer W1 in the first trench TC1 and recessing an upper portion of the first work function metal layer W1.

Referring back to FIG. 2A, the third mask pattern MA3 may be removed. First to third electrode patterns EL1 to EL3 may be respectively formed in the first to third trenches TC1 to TC3. The first to third electrode patterns EL1 to EL3 may be respectively formed on the first to third work function patterns WF1 to WF3. The first to third electrode patterns EL1 to EL3 may be formed using a low resistance, or low resistivity, metal.

Fourth to sixth gate electrodes GE4 to GE6 may be formed using formation methods similar to those of the first to third gate electrodes GE1 to GE3 discussed above with reference to FIGS. 11 to 14. In some embodiments, gate-all-around type transistors having different threshold voltages from each other may be selectively formed on the first to sixth regions RG1 to RG6.

Figure 15:
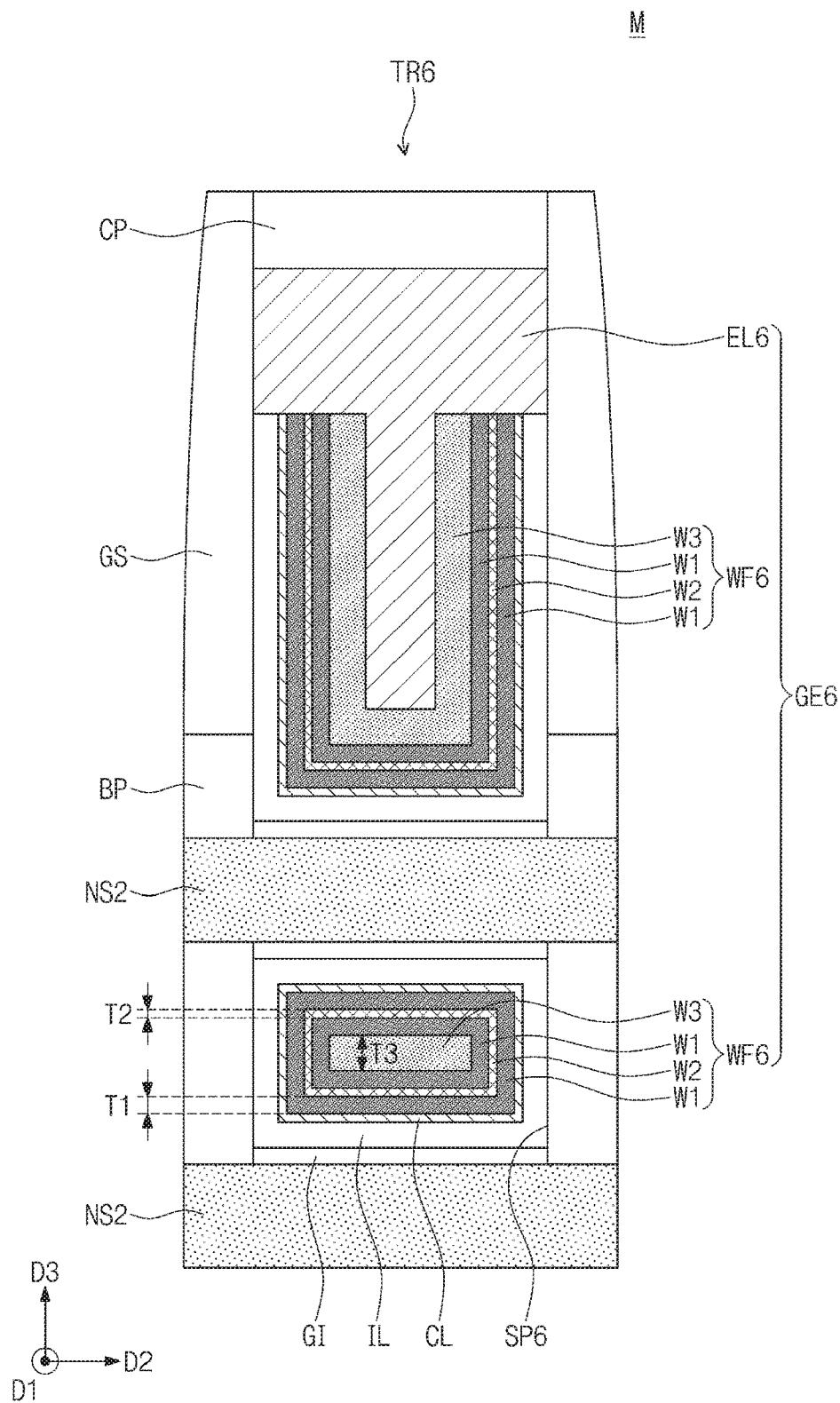
FIG. 15 illustrates an enlarged cross-sectional view of section M of FIG. 2B, partially showing a sixth transistor of a semiconductor device according to some example embodiments of inventive concepts.

FIG. 15 illustrates an enlarged cross-sectional view of section M of FIG. 2B, partially showing a sixth transistor of a semiconductor device according to some example embodiments of inventive concepts. In the embodiment that follows, a detailed description of technical features repetitive to those formerly discussed with reference to FIGS. 1 and 2A to 2D will be omitted and differences will be discussed in detail.

Referring to FIG. 15, unlike that shown in FIG. 2B, the sixth gate electrode GE6 may include layers whose thicknesses are different from each other. The first work function metal layer W1 of the sixth work function pattern WF6 may have a thickness greater than that of the second work function metal layer W2 of the sixth work function pattern WF6. For example, in the sixth space SP6, at least one of the first work function metal layers W1 may have a first thickness T1, and the second work function metal layer W2 may have a second thickness T2. The first thickness T1 may be greater than the second thickness T2.

The third work function metal layer W3 of the sixth work function pattern WF6 may have a thickness greater than that of each of the first and second work function metal layers W1 and W2 of the sixth work function pattern WF6. For example, in the sixth space SP6, the third work function metal layer W3 may have a third thickness T3. The third thickness T3 may be greater than the first thickness T1.

A semiconductor device according to some example embodiments of inventive concepts may be configured such that the gate-all-around type transistors are achieved to have various threshold voltages caused by a combination of work function metal layers.

Although some example embodiments of inventive concepts have been discussed with reference to accompanying figures, it will be understood that various changes in form and details may be made therein without departing from the spirit and scope of the present inventive concept. It therefore will be understood that the embodiments described above are just illustrative but not limitative in all aspects.

What is claimed is:

1. A semiconductor device, comprising:
a first transistor on a substrate; and
a second transistor on the substrate,
wherein each of the first and second transistors includes,
a plurality of semiconductor patterns vertically stacked on the substrate and vertically spaced apart from each other, and
a gate dielectric pattern and a work function pattern filling a space between the semiconductor patterns, wherein
the work function pattern of the first transistor includes a first work function metal layer,
the work function pattern of the second transistor includes the first work function metal layer and a second work function metal layer,
the first work function metal layer of each of the first and second transistors has a work function greater than that of the second work function metal layer, and
the first transistor has a threshold voltage less than that of the second transistor.

2. The device of claim 1, wherein the work function pattern of each of the first and second transistors completely fills the space between the semiconductor patterns.

3. The device of claim 1, wherein
each of the first and second transistors further comprises an electrode pattern on the work function pattern, and
the electrode pattern has resistance less than that of the work function pattern and does not fill the space.

4. The device of claim 1, wherein
the first work function metal layer of each of the first and second transistors comprises a metal nitride layer, and
the second work function metal layer comprises a metal nitride layer doped with an element from the group including silicon and aluminum.

5. The device of claim 4, wherein a silicon or aluminum doping concentration of the second work function metal layer is in a range from about 10 at % to about 30 at %.

6. The device of claim 1, wherein
the first transistor further includes a work function control liner between the work function pattern and the semiconductor patterns, and
the work function control liner is configured to generate a dipole that changes a threshold voltage of the first transistor.

7. The device of claim 1, further comprising:
a third transistor on the substrate; and
a fourth transistor on the substrate,
wherein each of the third and fourth transistors includes a plurality of semiconductor patterns vertically stacked on the substrate and vertically spaced apart from each other, and a gate dielectric pattern and a work function pattern that fill a space between the semiconductor patterns, wherein the work function pattern of the third transistor includes the first work function metal layer and a third work function metal layer, the work function pattern of the fourth transistor includes the first work function metal layer, the second work function metal layer, and the third work function metal layer, the third work function metal layer of each of the third and fourth transistors has a work function less than that of the second work function metal layer of the fourth transistor, the first and second transistors are PMOSFETs, and the third and fourth transistors are NMOSFETs.

8. The device of claim 7, wherein the second work function metal layer of the second transistor has a thickness greater than that of the second work function metal layer of the fourth transistor.

9. The device of claim 1, wherein the work function pattern of each of the first and second transistors surrounds a top surface, a bottom surface, and sidewalls of the semiconductor patterns.

10. The device of claim 1, wherein each of the first and second transistors further includes a pair of source/drain patterns, and the plurality of semiconductor patterns vertically stacked are between the pair of source/drain patterns.

11. A semiconductor device, comprising:

a first transistor on a substrate; and a second transistor on the substrate, wherein each of the first and second transistors includes, a plurality of semiconductor patterns vertically stacked on the substrate and vertically spaced apart from each other, and a gate dielectric pattern and a work function pattern that fill a space between the semiconductor patterns, wherein the space of the first transistor has the same size as that of the space of the second transistor, the work function pattern of the first transistor comprises a first work function metal layer, the work function pattern of the second transistor comprises the first work function metal layer and a second work function metal layer, and the first transistor has a threshold voltage different from that of the second transistor.

12. The device of claim 11, wherein the work function pattern in the space of the first transistor has a thickness the same as that of the work function pattern in the space of the second transistor.

13. The device of claim 11, wherein the first work function metal layer of each of the first and second transistors comprises a metal nitride layer, and the second work function metal layer comprises a metal nitride layer doped with an element from the group including silicon and aluminum.

14. The device of claim 11, wherein the first and second transistors are PMOSFETs, the first work function metal layer of each of the first and second transistors has a work function greater than that of the second work function metal layer, and the second work function metal layer of the second transistor has a thickness greater than that of the first work function metal layer of the second transistor.

15. The device of claim 11, wherein the first and second transistors are PMOSFETs, the first work function metal layer of each of the first and second transistors has a work function greater than that of the second work function metal layer, and the second work function metal layer of the second transistor has a thickness less than that of the first work function metal layer of the second transistor.

16. The device of claim 11, wherein the threshold voltage of the first transistor based on the first work function metal layer, and the threshold voltage of the second transistor based on the first work function metal layer and the second work function metal layer.

17. The device of claim 11, wherein the work function pattern of the first transistor excludes the second work function metal layer.

18. A semiconductor device, comprising:

a first transistor on a substrate; and a second transistor on the substrate, wherein each of the first and second transistors includes, a plurality of semiconductor patterns vertically stacked on the substrate and vertically spaced apart from each other, and a gate dielectric pattern and a work function pattern that fill a space between the semiconductor patterns, the work function pattern of the first transistor comprises a first work function metal layer, the work function pattern of the second transistor comprises the first work function metal layer and a second work function metal layer, and the first work function metal layer of the first transistor completely fills the space between the semiconductor patterns, the first work function metal layer of the second transistor partially fills the space between the semiconductor patterns, the first transistor has a threshold voltage different from that of the second transistor.

19. The device of claim 18, wherein the first and second transistors are PMOSFETs, the first work function metal layer of each of the first and second transistors has a work function greater than that of the second work function metal layer, and the second work function metal layer of the second transistor has a thickness greater than that of the first work function metal layer of the second transistor.

20. The device of claim 18, wherein the first and second transistors are PMOSFETs, the first work function metal layer of each of the first and second transistors has a work function greater than that of the second work function metal layer, and the second work function metal layer of the second transistor has a thickness less than that of the first work function metal layer of the second transistor.

* * * * *